US012563922B2

(12) United States Patent
Ding et al.

(10) Patent No.: US 12,563,922 B2
(45) Date of Patent: Feb. 24, 2026

(54) DISPLAY SUBSTRATE, PREPARING METHOD THEREFOR, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Xiaoqi Ding, Beijing (CN); Changchang Liu, Beijing (CN); Xuewei Tian, Beijing (CN); Ke Liu, Beijing (CN); Fei Fang, Beijing (CN); Liqiang Chen, Beijing (CN); Ling Shi, Beijing (CN); Shuo Li, Beijing (CN); Guoyi Cui, Beijing (CN); Xinlei Yang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 514 days.

(21) Appl. No.: 18/016,869

(22) PCT Filed: Feb. 25, 2022

(86) PCT No.: PCT/CN2022/078074
§ 371 (c)(1),
(2) Date: Jan. 19, 2023

(87) PCT Pub. No.: WO2023/159511
PCT Pub. Date: Aug. 31, 2023

(65) Prior Publication Data
US 2024/0251611 A1 Jul. 25, 2024

(51) Int. Cl.
H10K 59/131 (2023.01)
H10K 59/124 (2023.01)
H10K 102/00 (2023.01)

(52) U.S. Cl.
CPC ......... H10K 59/131 (2023.02); H10K 59/124 (2023.02); *H10K 2102/311* (2023.02)

(58) Field of Classification Search
CPC .......................... H10K 59/131; H10K 59/124
See application file for complete search history.

(56) References Cited

U.S. PATENT DOCUMENTS

2021/0257438 A1* 8/2021 Cho ........................ H10K 59/88
2021/0359074 A1* 11/2021 You ...................... H10K 59/121
(Continued)

FOREIGN PATENT DOCUMENTS

CN 111653603 A 9/2020
CN 111724742 A 9/2020
(Continued)

*Primary Examiner* — Kevin M Nguyen
(74) *Attorney, Agent, or Firm* — Ling Wu; Stephen Yang; Ling and Yang Intellectual Property

(57) ABSTRACT

A display substrate, a preparing method therefor, and a display apparatus are disclosed. The display substrate includes a display region (100), the display region (100) includes a plurality of sub-pixels, at least one sub-pixel includes a circuit unit disposed on the base substrate (101), the circuit unit at least includes a pixel drive circuit and a data signal line (60), the pixel drive circuit is connected with the data signal line (60); the base substrate (101) includes a base substrate conductive layer disposed between the first flexible layer (101A) and the second flexible layer (101C), the base substrate conductive layer at least includes a data fan-out line (70), and the data signal line (60) is connected with the data fan-out line (70) through a lapping via (DV1).

13 Claims, 16 Drawing Sheets

(56) References Cited

U.S. PATENT DOCUMENTS

| | | |
|---|---|---|
| 2022/0121072 A1* | 4/2022 | Chen ........................ H01L 21/77 |
| 2022/0165835 A1 | 5/2022 | Zhao et al. |
| 2022/0384558 A1 | 12/2022 | Xu et al. |
| 2023/0043145 A1 | 2/2023 | Yuan et al. |

FOREIGN PATENT DOCUMENTS

| | | |
|---|---|---|
| CN | 112310125 A | 2/2021 |
| CN | 112420799 A | 2/2021 |
| CN | 113327516 A | 8/2021 |
| CN | 113870713 A | 12/2021 |
| CN | 113964142 A | 1/2022 |
| WO | 2021138920 A1 | 7/2021 |

* cited by examiner

DISPLAY SUBSTRATE, PREPARING METHOD THEREFOR, AND DISPLAY APPARATUS

CROSS-REFERENCE TO RELATED APPLICATION

The present application is a U.S. National Phase Entry of International Application No. PCT/CN2022/078074 having an international filing date of Feb. 25, 2022, the entire content of which is hereby incorporated by reference.

TECHNICAL FIELD

The present disclosure relates to, but is not limited to, the field of display technologies, and particularly to a display substrate, a preparation method therefor, and a display apparatus.

BACKGROUND

An Organic Light Emitting Diode (OLED for short) and a Quantum dot Light Emitting Diode (QLED for short) are active light emitting display devices and have advantages such as self-luminescence, a wide viewing angle, a high contrast ratio, low power consumption, extremely high response speed, lightness and thinness, flexibility, and low cost. With constant development of display technologies, a flexible display that uses an OLED or a QLED as a light emitting device and performs signal control by a Thin Film Transistor (TFT for short) has become a mainstream product in the field of display at present.

SUMMARY

The following is a summary of subject matters described herein in detail. The summary is not intended to limit the protection scope of claims.

In one aspect, the present disclosure provides a display substrate including a display region, wherein the display region includes a plurality of sub-pixels, at least one sub-pixel includes a circuit unit disposed on the base substrate, the circuit unit at least includes a pixel drive circuit and a data signal line, the pixel drive circuit is connected with the data signal line; the base substrate includes a first flexible layer, a second flexible layer and a base substrate conductive layer disposed between the first flexible layer and the second flexible layer, the base substrate conductive layer of the at least one sub-pixel at least includes a data fan-out line, and the data signal line is connected with the data fan-out line through a lapping via.

In an exemplary implementation, the display region includes a plurality of pixel rows sequentially disposed along a second direction, each pixel row includes a plurality of sub-pixels sequentially disposed along a first direction, the second direction is an extension direction of the data signal line, the first direction intersects with the second direction; the display region is provided with a lapping zone at a middle portion in the second direction, the lapping zone includes at least one pixel row, and the lapping via is disposed in at least one sub-pixel of the lapping zone.

In an exemplary implementation, lapping vias are disposed in a plurality of sub-pixels of one pixel row in the lapping zone, or lapping vias are disposed in a plurality of sub-pixels of a plurality of pixel rows in the lapping zone, and at least part of data signal lines are connected with data fan-out lines through the lapping vias.

In an exemplary implementation, the circuit unit includes a lapping electrode connected with the data fan-out line through a first lapping via, and the data signal line connected with the lapping electrode through a second lapping via.

In an exemplary implementation, at least one sub-pixel further includes a light emitting device disposed at a side of the circuit unit away from the base substrate, the light emitting device at least includes an anode, and the anode is connected with the pixel drive circuit through an anode via, and an orthographic projection of the first lapping via in a plane of the display substrate is not overlapped with an orthographic projection of the anode via in the plane of the display substrate.

In an exemplary implementation, the light emitting device further includes a pixel definition layer on which a pixel opening is provided, and the pixel opening exposes the anode; an orthographic projection of the pixel opening in the plane of the display substrate is not overlapped with the orthographic projection of the anode via in the plane of the display substrate.

In an exemplary implementation, the orthographic projection of the pixel opening in the plane of the display substrate is not overlapped with the orthographic projection of the first lapping via in the plane of the display substrate, a distance between an edge of a side of the pixel opening close to the first lapping via and an edge of a side of the first lapping via close to the pixel opening is greater than or equal to 2.5 μm, a distance between an edge of a side of the pixel opening close to the anode via and an edge of a side of the anode via close to the pixel opening is greater than or equal to 3.0 μm, a distance between an edge of a side of the first lapping via close to the anode via and an edge of a side of the anode via close to the first lapping via is greater than or equal to 2.5 μm.

In an exemplary implementation, the base substrate conductive layer further includes a power supply electrode disposed in a region other than the data fan-out line, and the power supply electrode is in an entire surface structure or a mesh structure.

In an exemplary implementation, in the plane perpendicular to the display substrate, the circuit unit includes a semiconductor layer, a first conductive layer, a second conductive layer, a third conductive layer and a fourth conductive layer that are sequentially disposed on the base substrate; the semiconductor layer at least includes active layers of a plurality of transistors, the first conductive layer at least includes gate electrodes of a plurality of transistors and a first plate of a storage capacitor, the second conductive layer at least includes a second plate of the storage capacitor, the third conductive layer at least includes the data signal line, and the fourth conductive layer at least includes an anode connection electrode.

In an exemplary implementation, the second conductive layer further includes a lapping electrode connected with the data fan-out line through a first lapping via, and the data signal line connected with the lapping electrode through a second lapping via.

In an exemplary implementation, in the plane perpendicular to the display substrate, the pixel drive circuit includes a first semiconductor layer, a first conductive layer, a second conductive layer, a second semiconductor layer, a third conductive layer, a fourth conductive layer and a fifth conductive layer that are sequentially disposed on the base substrate, the first semiconductor layer at least includes active layers of a plurality of low temperature polysilicon transistors, the first conductive layer at least includes gate electrodes of a plurality of low temperature polysilicon transistors and a first plate of a storage capacitor, the second conductive layer at least includes lower gate electrodes of oxide transistors and a second plate of the storage capacitor, the second semiconductor layer at least includes active layers of oxide transistors, the third conductive layer at least includes upper gate electrodes of oxide transistors, the fourth conductive layer at least includes the data signal line, and the fifth conductive layer at least includes an anode connection electrode.

In an exemplary implementation, the third conductive layer includes a lapping electrode, the lapping electrode is connected with the data fan-outline through a first lapping via, and the data signal line is connected with the lapping electrode through a second lapping via.

In an exemplary implementation, the base substrate conductive layer further includes a shield layer, and an orthographic projection of an active layer of a low temperature polysilicon transistor in the plane of the display substrate is within a range of an orthographic projection of the shield layer in the plane of the display substrate.

In another aspect, the present disclosure further provides a display apparatus, including the aforementioned display substrate.

In another aspect, the present disclosure further provides a method for preparing a display substrate including a display region, and the display region includes a plurality of sub-pixels, wherein at least one sub-pixel includes a circuit unit disposed on a base substrate, the preparing method includes:

forming a base substrate, wherein the base substrate includes a first flexible layer, a second flexible layer, and a base substrate conductive layer disposed between the first flexible layer and the second flexible layer, wherein the base substrate conductive layer of at least one sub-pixel at least includes a data fan-out line; and forming a circuit unit on the base substrate, wherein the circuit unit at least includes a pixel drive circuit and a data signal line, and the pixel drive circuit is connected with the data signal line, the data signal line is connected with the data fan-out line through a lapping via.

Other aspects may be understood upon reading and understanding the drawings and the detailed description.

BRIEF DESCRIPTION OF DRAWINGS

The accompanying drawings are used for providing understanding of technical solutions of the present disclosure, and form a part of the specification. They are used for explaining the technical solutions of the present disclosure together with the embodiments of the present disclosure, but do not form a limitation on the technical solutions of the present disclosure.

4

Figure 5:
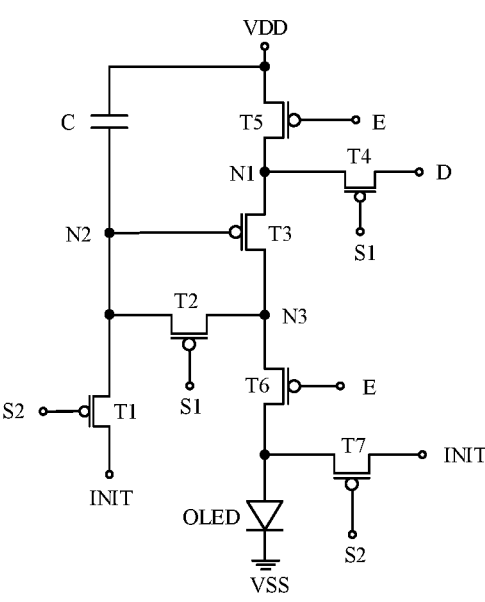

FIG. 5 is a schematic diagram of an equivalent circuit of a pixel drive circuit.

Figure 6:
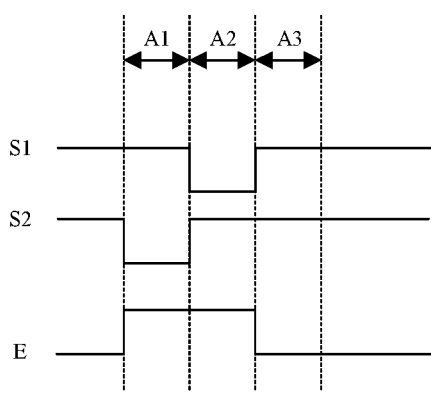

FIG. 6 is a working timing diagram of a pixel drive circuit.

Figure 7:
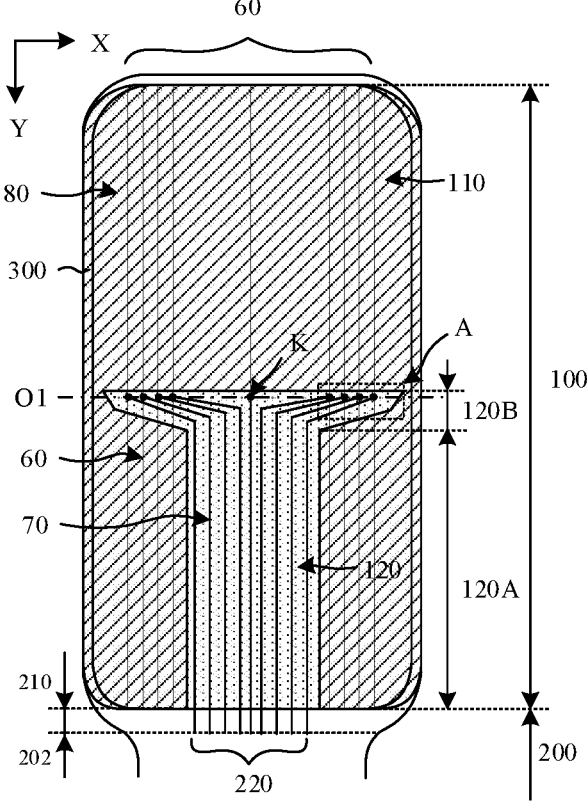

FIG. 7 is a schematic diagram of a planar structure of a display substrate according to an exemplary embodiment of the present disclosure.

Figure 8:
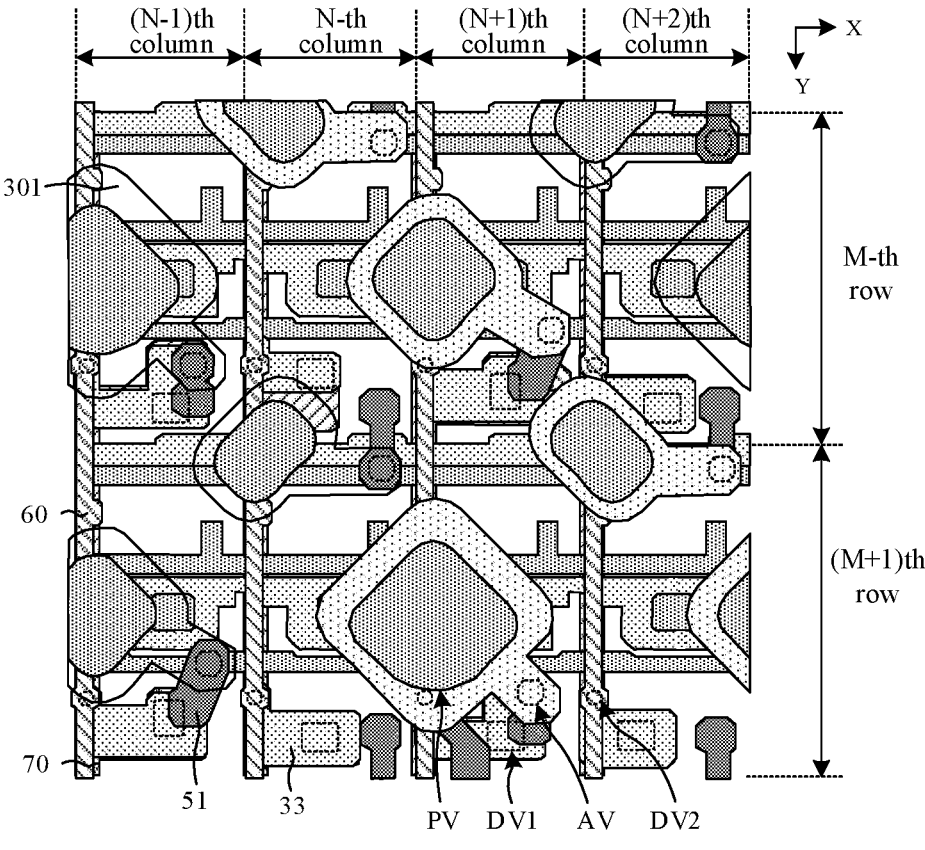

FIG. 8 is a schematic diagram of a planar structure of a trace pixel zone according to an exemplary embodiment of the present disclosure.

Figure 9:
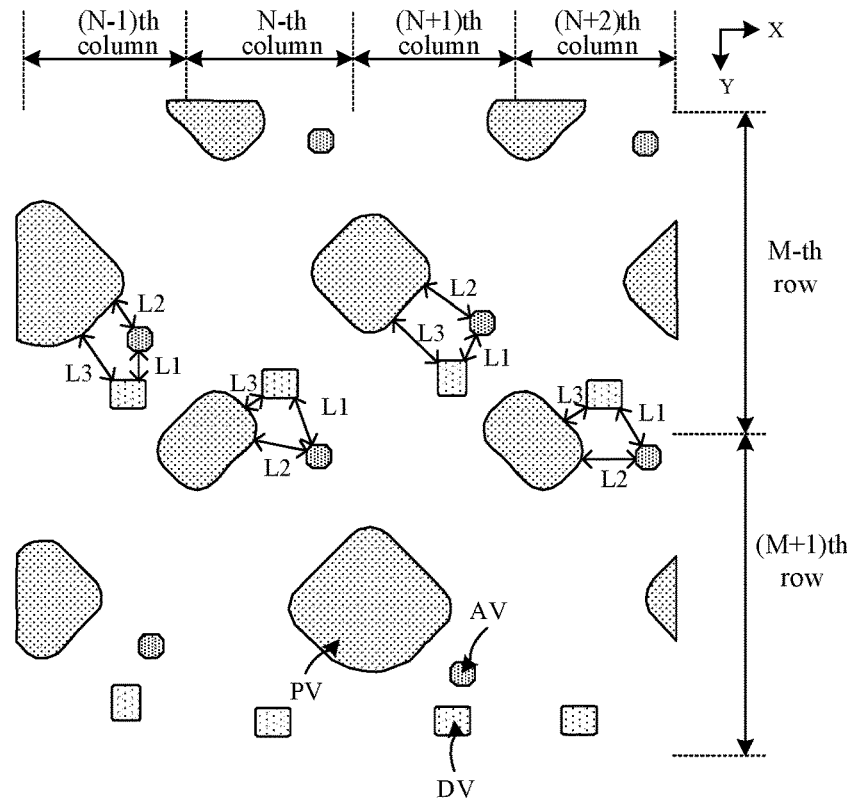

FIG. 9 is a schematic diagram of a positional relationship of the first lapping via, the anode via and the pixel opening in FIG. 8.

Figure 10:
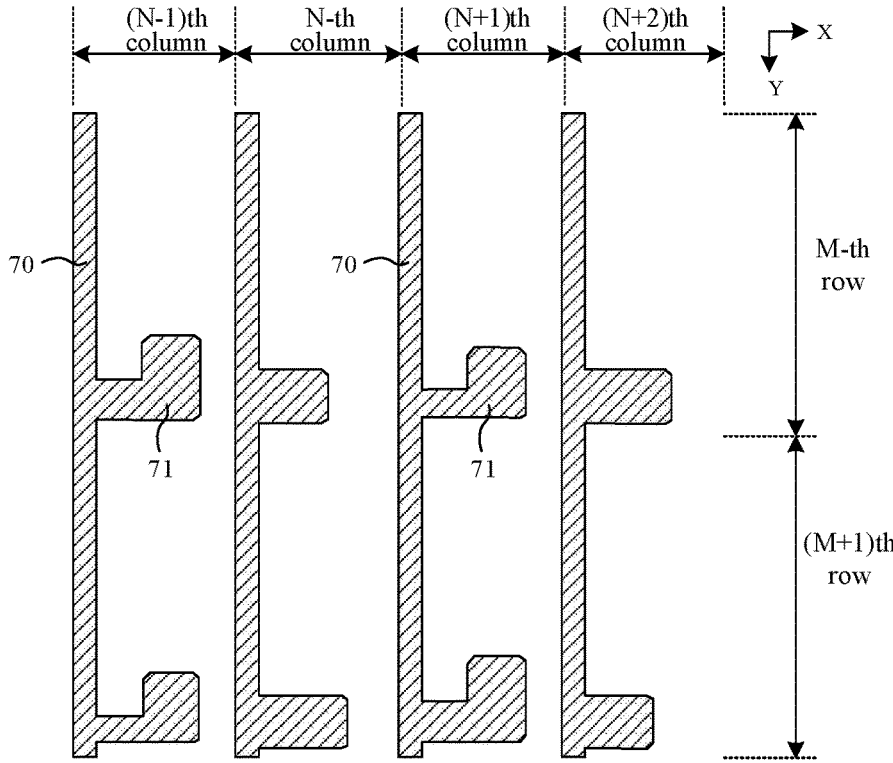

FIG. 10 is a schematic diagram obtained after a pattern of a base substrate is formed according to an exemplary embodiment of the present disclosure.

Figure 11A:
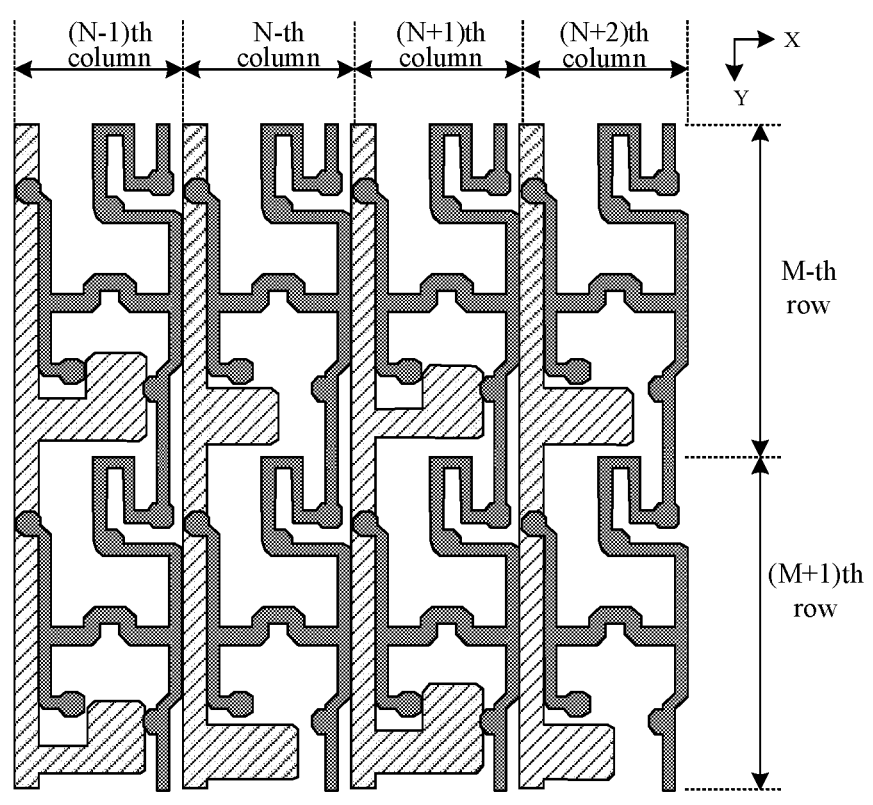
Figure 11B:
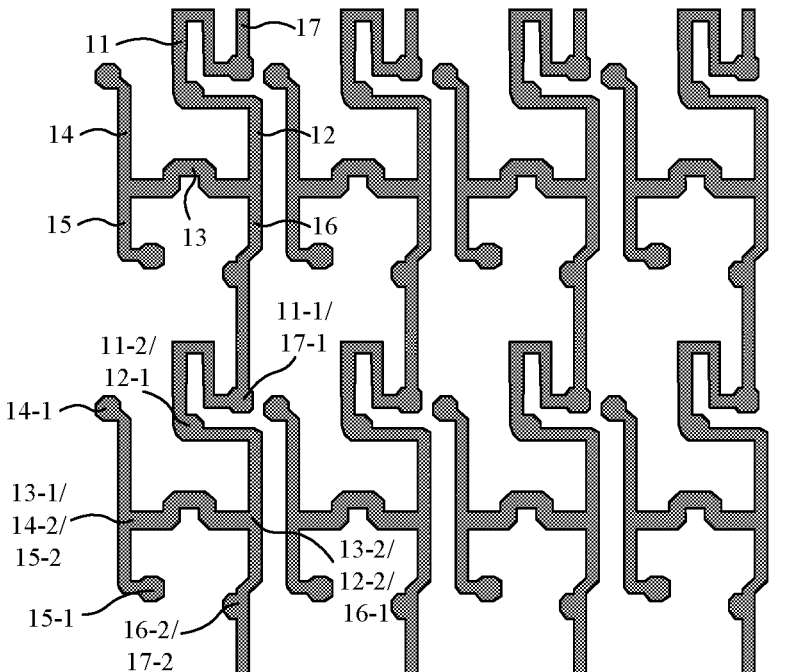

FIG. 11a and FIG. 11b are schematic diagrams obtained after a pattern of a semiconductor layer is formed according to an embodiment of the present disclosure.

Figure 12A:
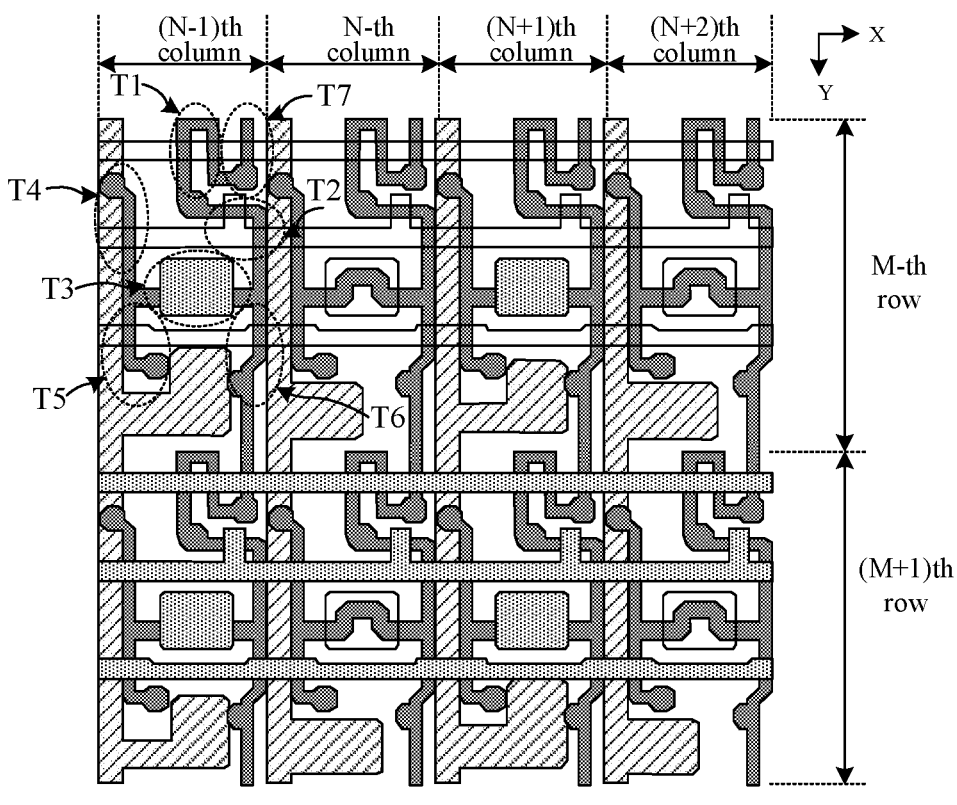
Figure 12B:
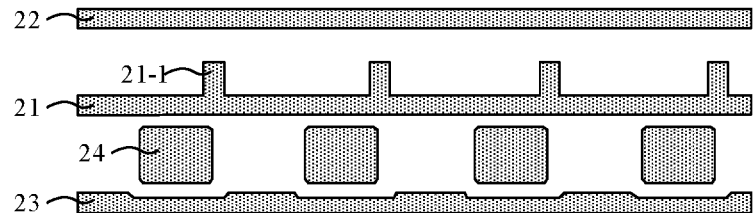
Figure 12B:
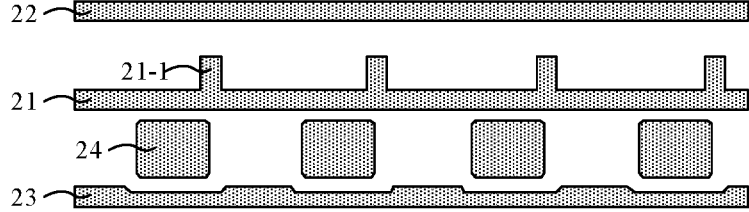

FIG. 12a and FIG. 12b are schematic diagrams obtained after a pattern of a first conductive layer is formed according to an embodiment of the present disclosure.

Figure 13:
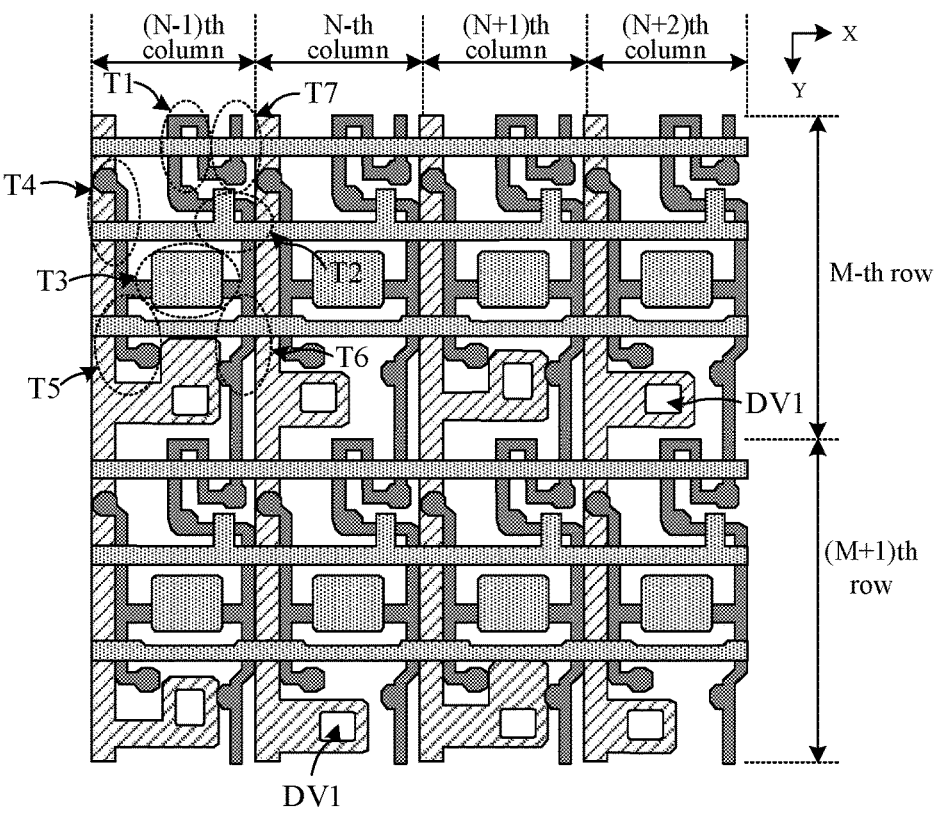

FIG. 13 is a schematic diagram obtained after a pattern of a third insulation layer is formed according to an embodiment of the present disclosure.

Figure 14A:
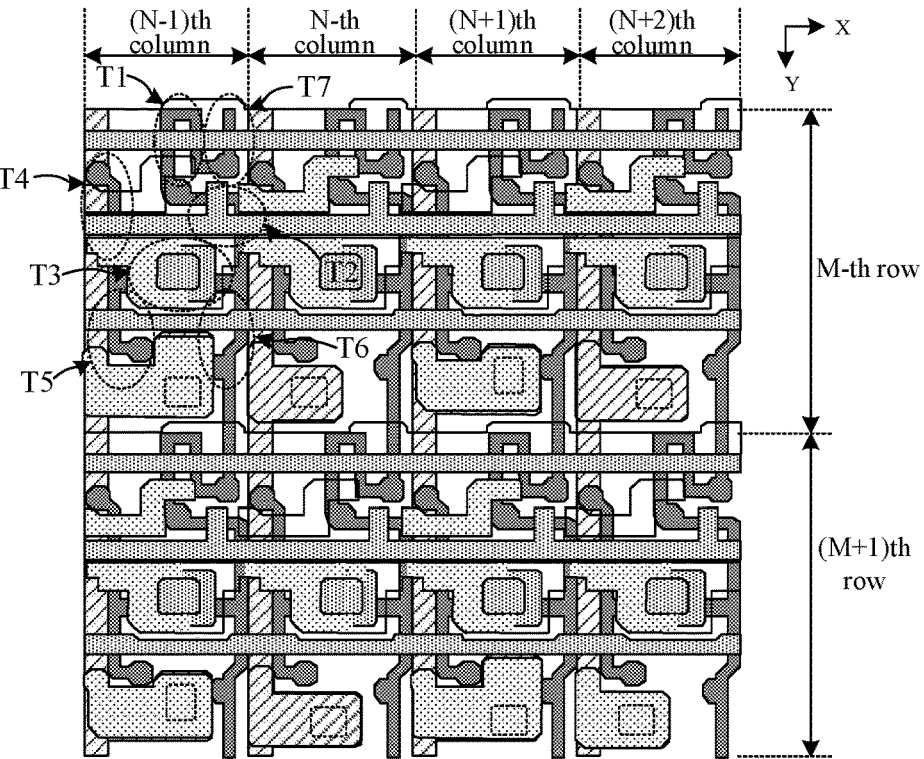
Figure 14B:
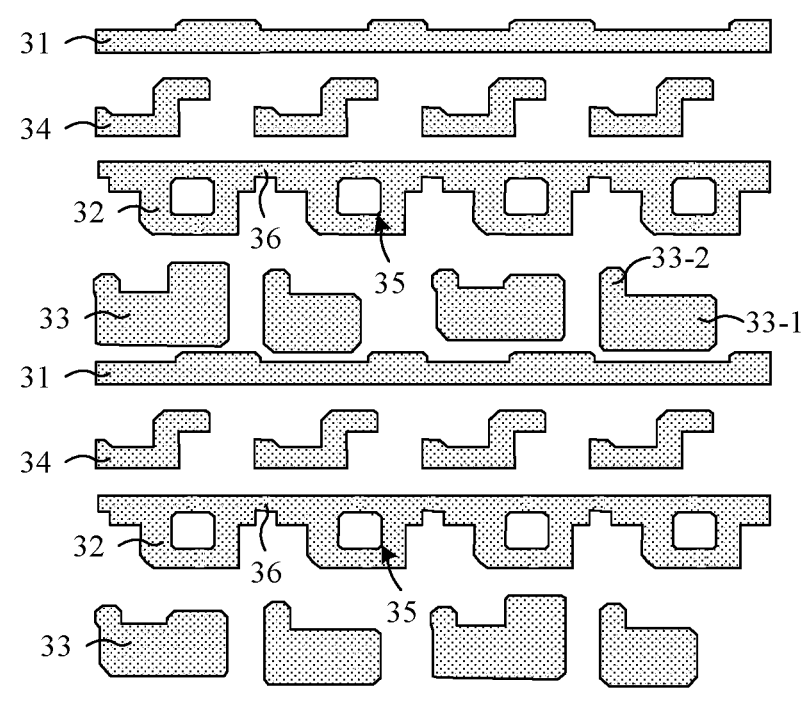

FIG. 14a and FIG. 14b are schematic diagrams obtained after a pattern of a second conductive layer is formed according to an embodiment of the present disclosure.

Figure 15:
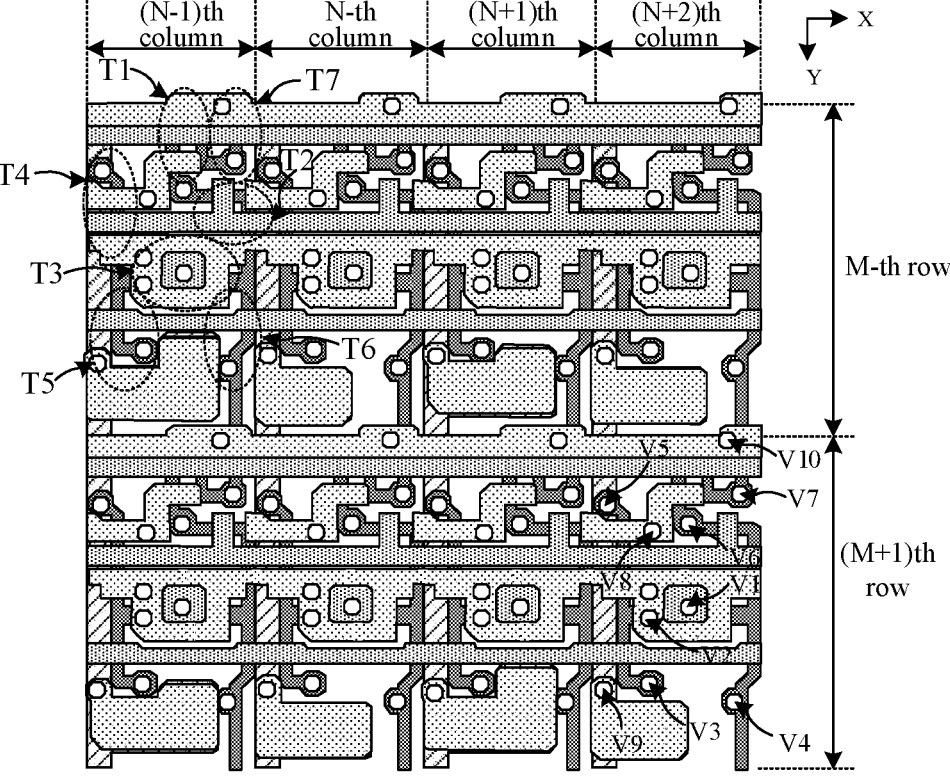

FIG. 15 is a schematic view obtained after a pattern of a fourth insulation layer is formed according to an embodiment of the present disclosure.

Figure 16A:
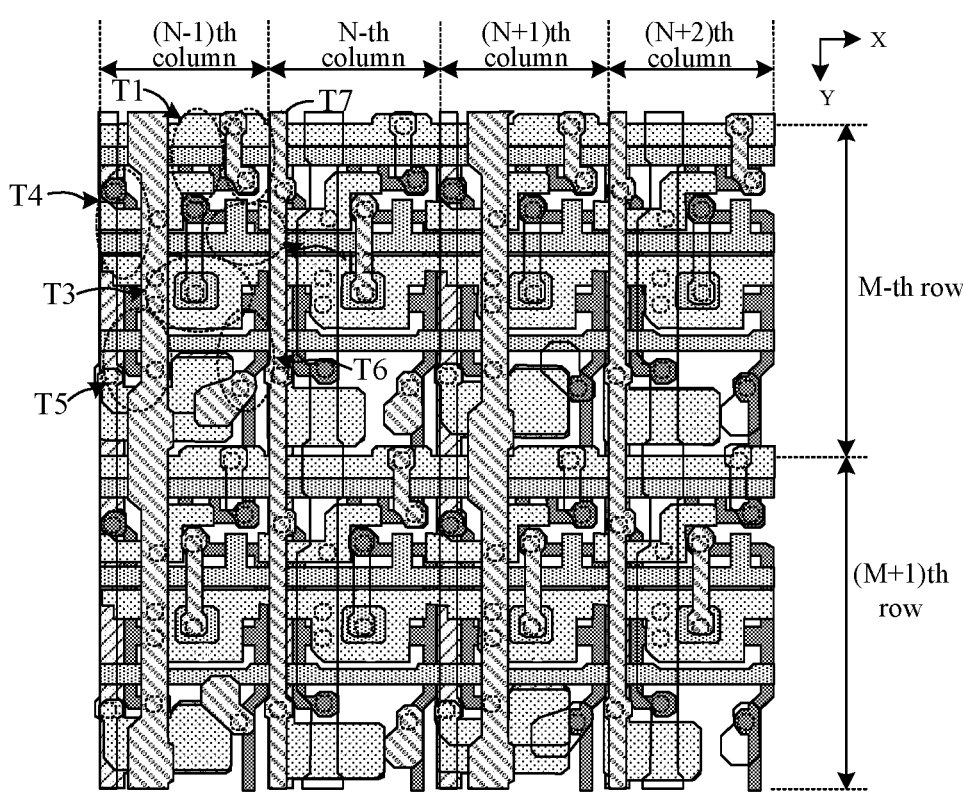
Figure 16B:
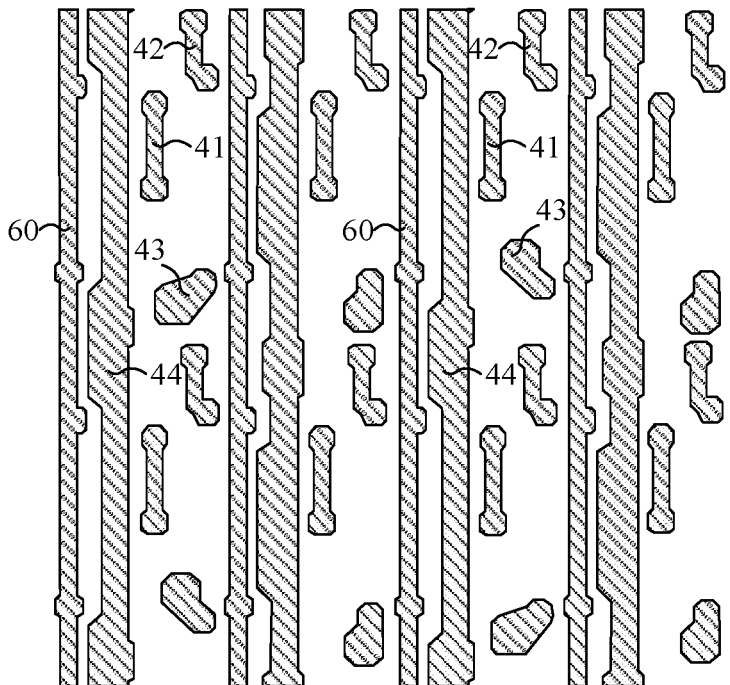

FIG. 16a and FIG. 16b are schematic diagrams obtained after a pattern of a third conductive layer is formed according to an embodiment of the present disclosure.

Figure 17:
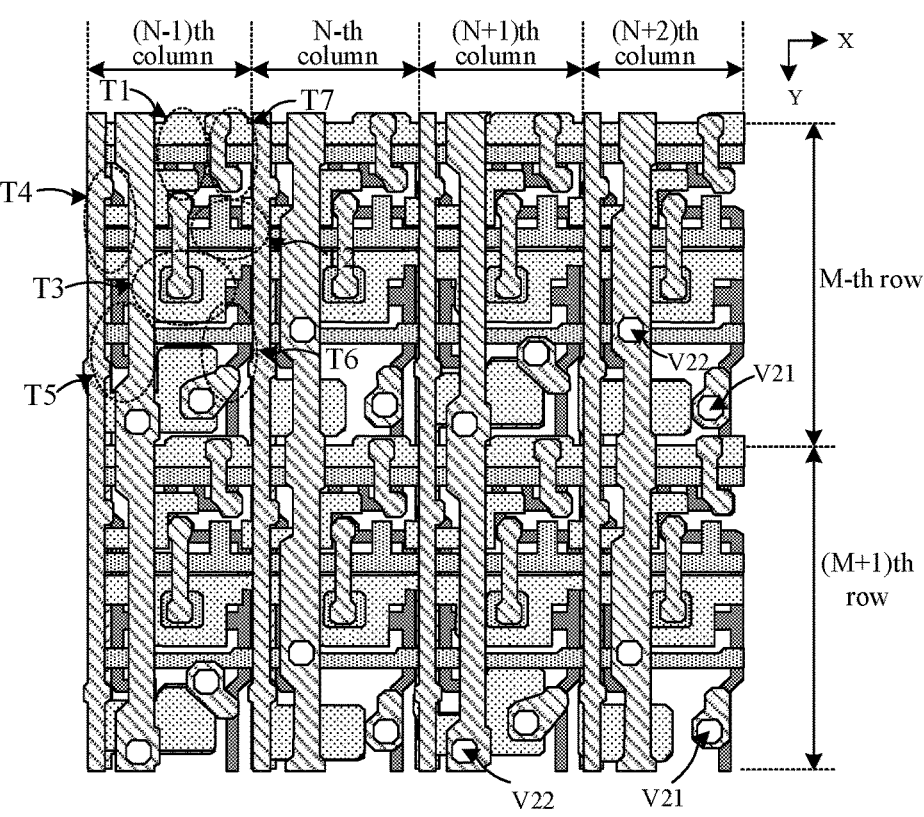

FIG. 17 is a schematic diagram obtained after a pattern of a first planarization layer is formed according to an embodiment of the present disclosure.

Figure 18A:
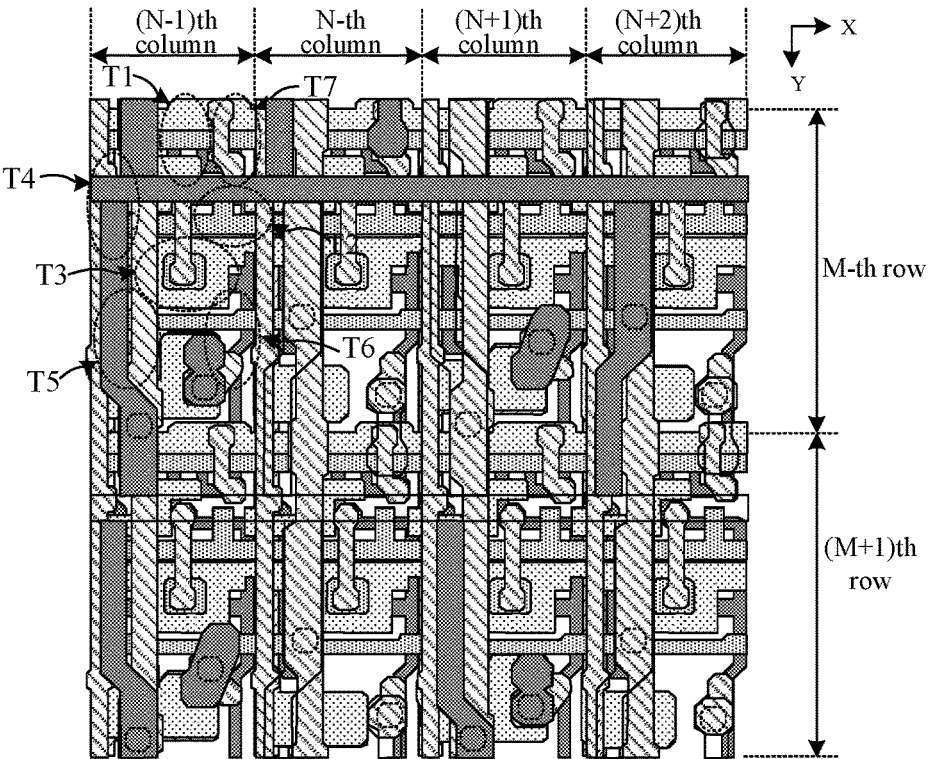
Figure 18B:
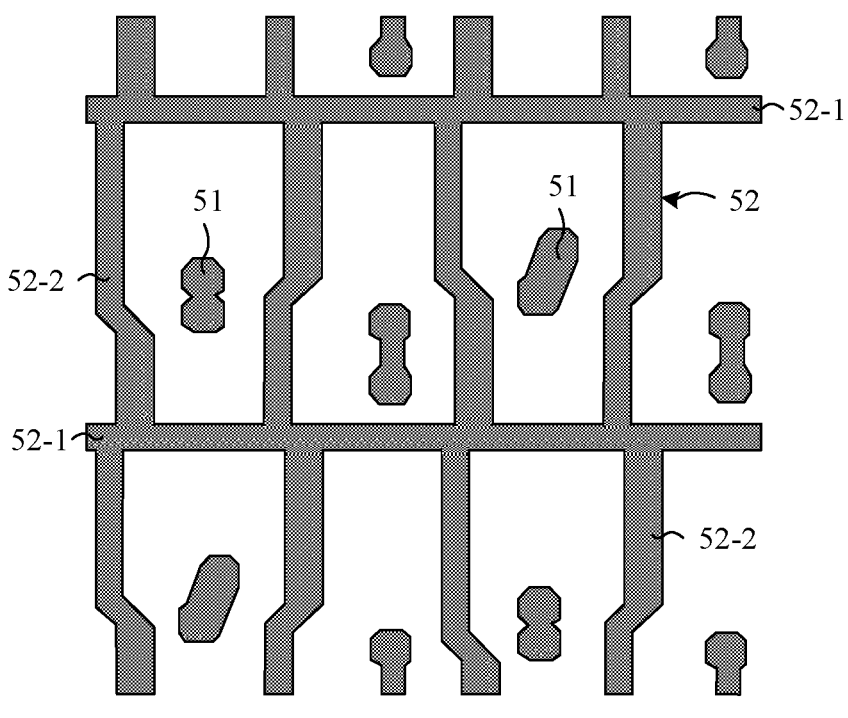

FIG. 18a and FIG. 18b are schematic diagrams obtained after a pattern of a fourth conductive layer is formed according to an embodiment of the present disclosure.

Figure 19A:
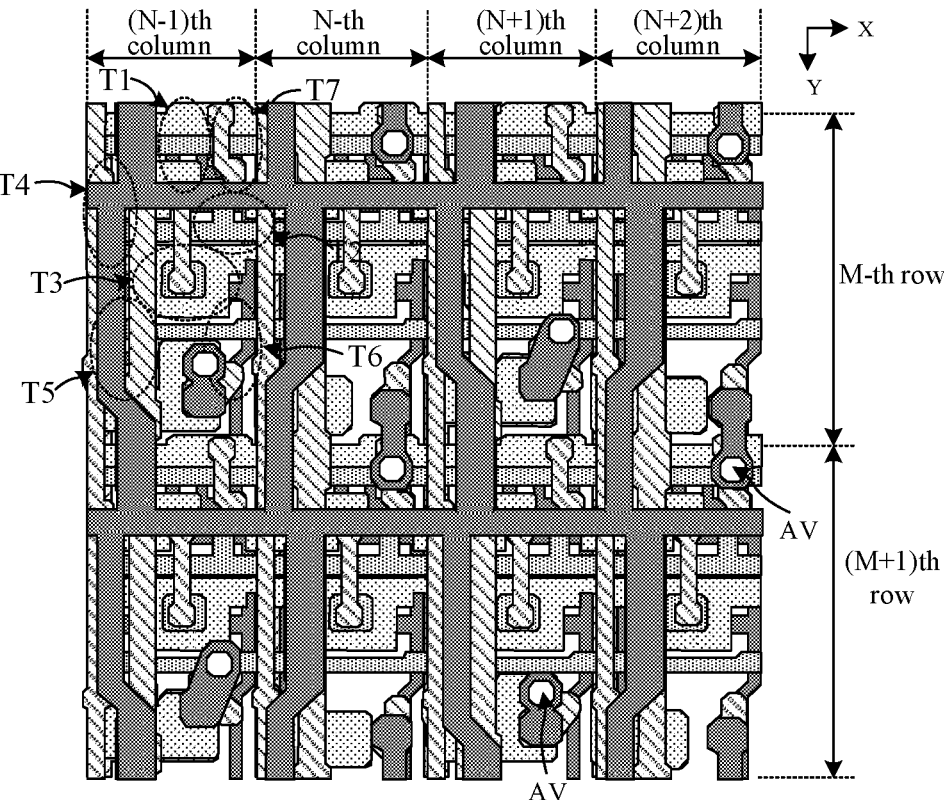
Figure 19B:
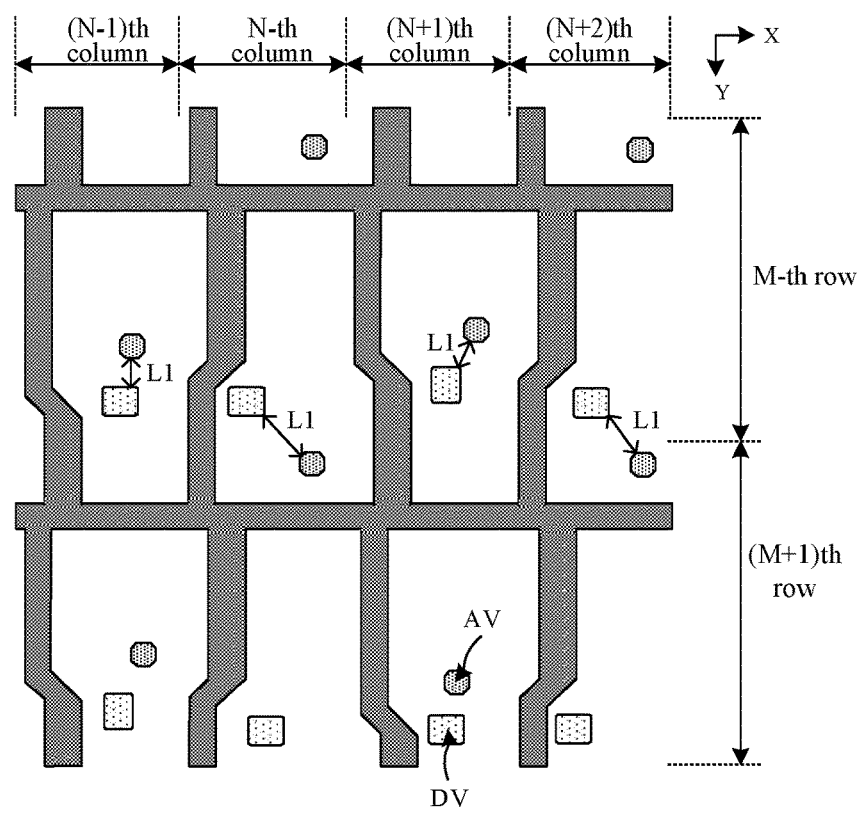

FIG. 19a and FIG. 19b are schematic diagrams obtained after a pattern of a second planarization layer is formed according to an embodiment of the present disclosure.

Figure 20A:
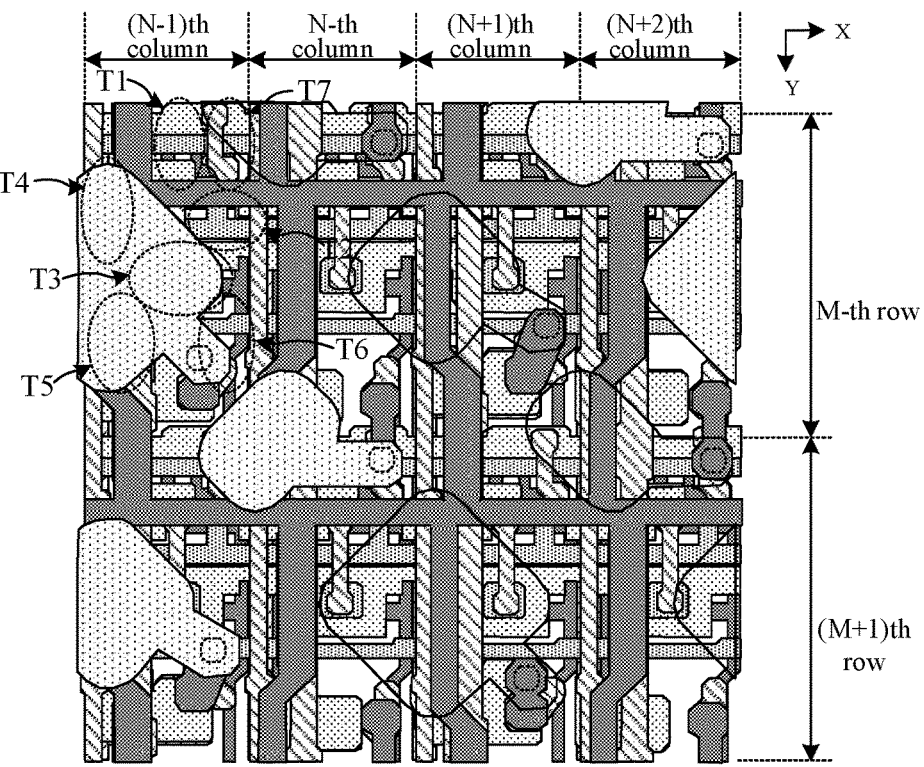
Figure 20B:
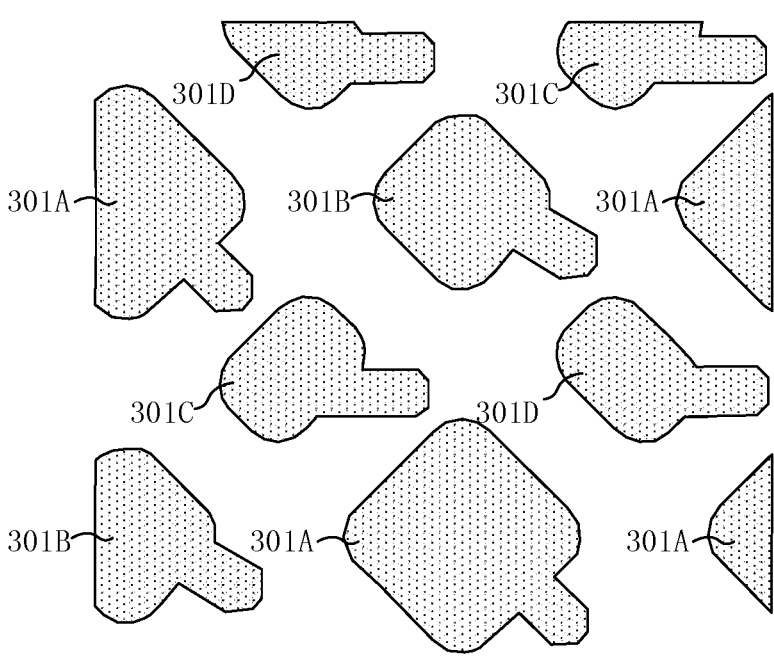

FIG. 20a and FIG. 20b are schematic diagrams obtained after a pattern of an anode conductive layer is formed according to an exemplary embodiment of the present disclosure.

Figure 21A:
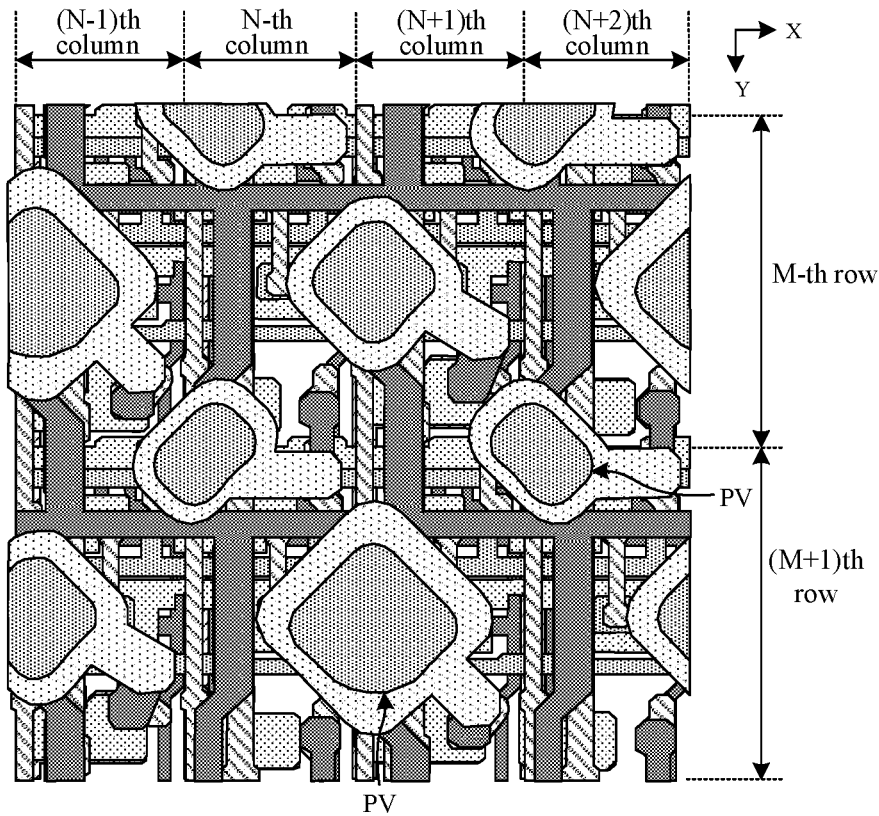
Figure 21B:
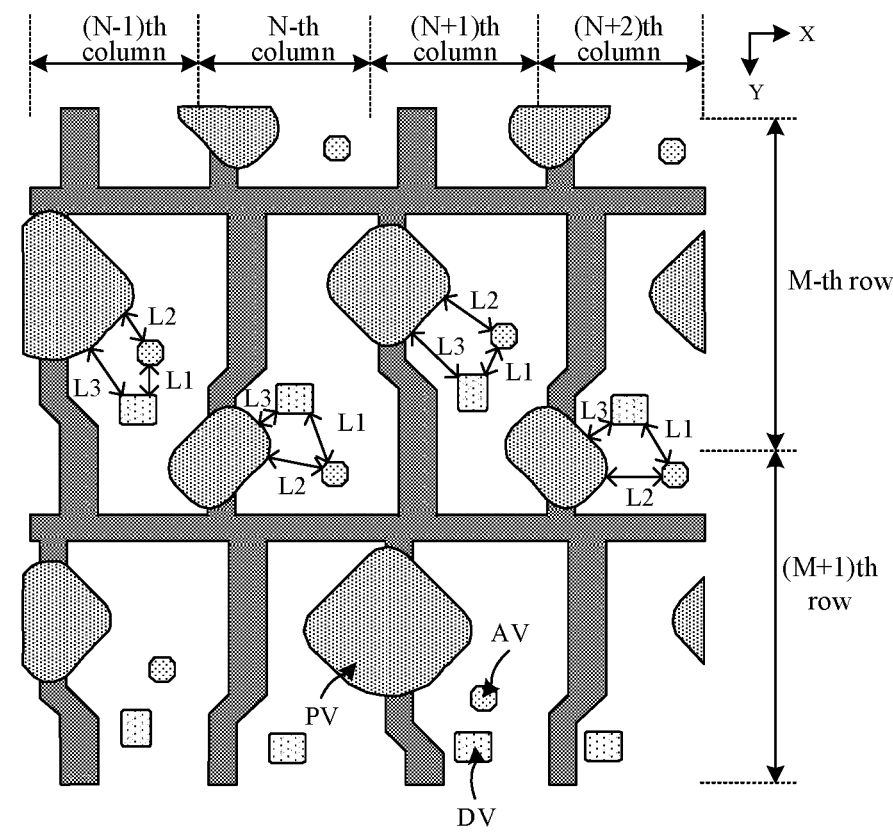

FIG. 21a and FIG. 21b are schematic diagrams obtained after a pixel definition layer pattern is formed according to an embodiment of the present disclosure.

Figure 22:
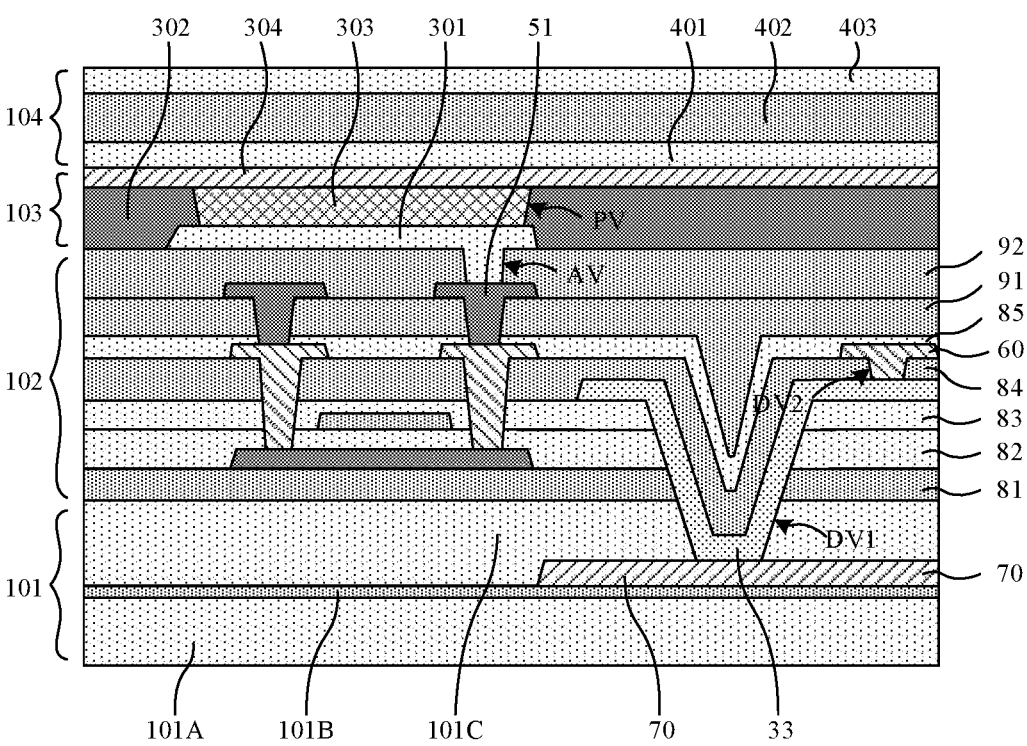

FIG. 22 is a schematic diagram of a sectional structure of a display substrate according to an exemplary embodiment of the present disclosure.

Figure 23:
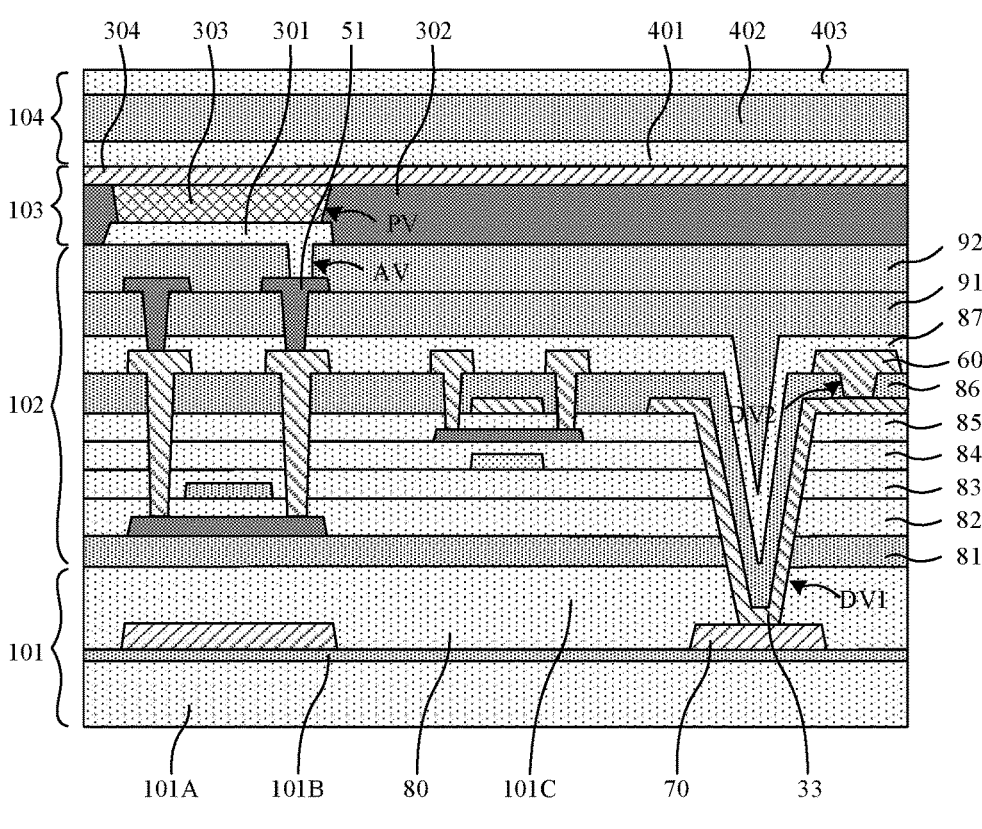

FIG. 23 is a schematic diagram of a sectional structure of another display substrate according to an exemplary embodiment of the present disclosure.

Figure 24:
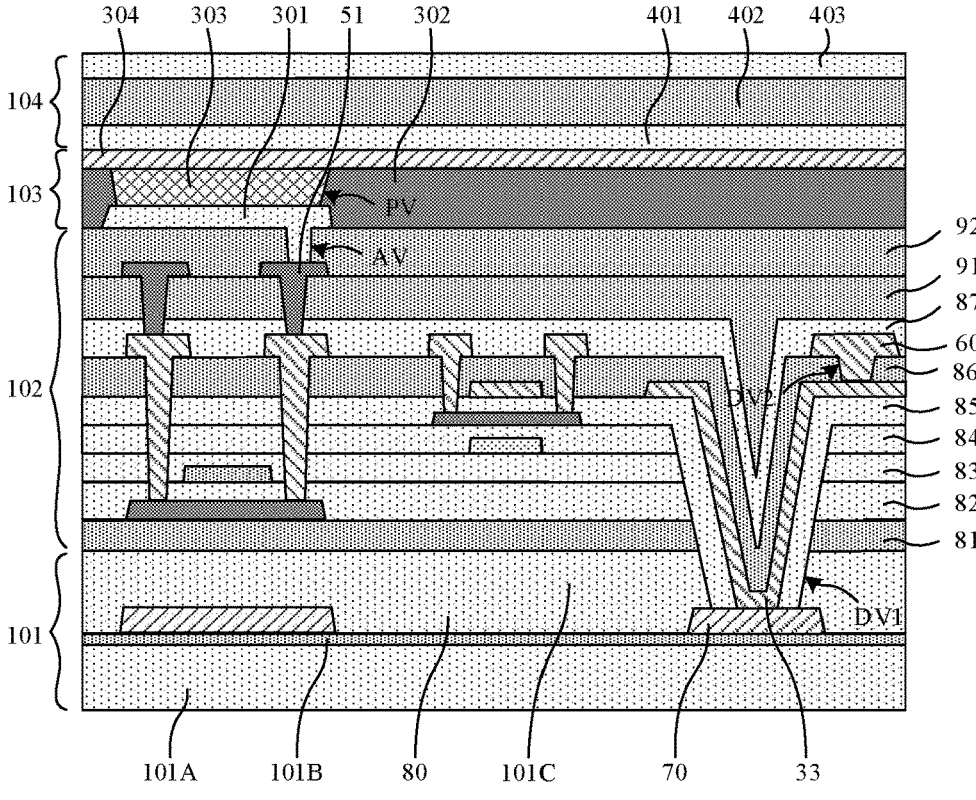

FIG. 24 is a schematic diagram of a sectional structure of yet another display substrate according to an exemplary embodiment of the present disclosure.

| Description of reference signs: | | |
| --- | --- | --- |
| 11-first active layer; | 12-second active layer; | 13-third active layer; |
| 14-fourth active layer; | 15-fifth active layer; | 16-sixth active layer; |
| 17-seventh active layer; | 21-first scan signal line | 22-second scan signal |

-continued

| Description of reference signs: | | |
|---|---|---|
| 23- light emitting control line; | 24-first plate; | 31-initial signal line; |
| 32-second plate; | 33-lapping electrode; | 34-shield electrode; |
| 35-opening; | 36-plate connection line; | 41-first connection electrode; |
| 42-second connection electrode; | 43-third connection electrode; | 44-first power supply line; |
| 51-anode connection electrode; | 52-power connection line; | 60-data signal line; |
| 70-data fan-out line; | 71-connection block; | 80-power supply electrode; |
| 81-first insulation layer; | 82-second insulation layer; | 83-third insulation layer; |
| 84-fourth insulation layer; | 85-fifth insulation layer; | 86-sixth insulation layer; |
| 87-seventh insulation layer; | 91-first planarization layer; | 92-second planarization layer; |
| 100-display region; | 101-base substrate; | 101-base substrate; |
| 101A-first flexible layer; | 101B-barrier layer; | 101C-second flexible layer; |
| 102-drive circuit layer; | 103-light emitting structure layer; | 104-encapsulation structure layer; |
| 110-normal pixel zone; | 120-trace pixel zone; | 120A-trace zone; |
| 120B-lapping zone; | 200-bonding region; | 201-fan-out zone; |
| 202-bending needle region; | 210-lead line zone; | 220-lead line; |
| 300-bezel region; | 301-anode; | 302-pixel definition layer; |
| 303-organic light emitting layer; | 304-cathode; | 401-first encapsulation layer; |
| 402-second encapsulation layer; | 403-third encapsulation layer. | |

DETAILED DESCRIPTION

To make objectives, technical solutions, and advantages of the present disclosure clearer, the embodiments of the present disclosure will be described in detail with reference to the accompanying drawings. It is to be noted that implementations may be implemented in a plurality of different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other without conflict.

Scales of the drawings in the present disclosure may be used as a reference in the actual process, but are not limited thereto. For example, the width-length ratio of the channel, the thickness and spacing of each film layer, and the width and spacing of each signal line may be adjusted according to actual needs. The number of pixels in the display substrate and the number of sub-pixels in each pixel are not limited to the numbers shown in the drawings. The drawings described in the present disclosure are schematic structure diagrams only, and one implementation of the present disclosure is not limited to the shapes, numerical values or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skill in the art may understand specific meanings of these terms in the present disclosure according to specific situations.

In the specification, a transistor refers to a component which includes at least three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode", as well as the "source terminal" and the "drain terminal" are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulating film" may be replaced with an "insulation layer" sometimes.

Triangle, rectangle, trapezoid, pentagon and hexagon in this specification are not strictly defined, and they may be approximate triangle, rectangle, trapezoid, pentagon or hexagon, etc. There may be some small deformation caused by tolerance, and there may be chamfer, arc edge and deformation, etc. In the present disclosure, "about" refers to that a boundary is defined not so strictly and numerical values within process and measurement error ranges are allowed.

Figure 1:
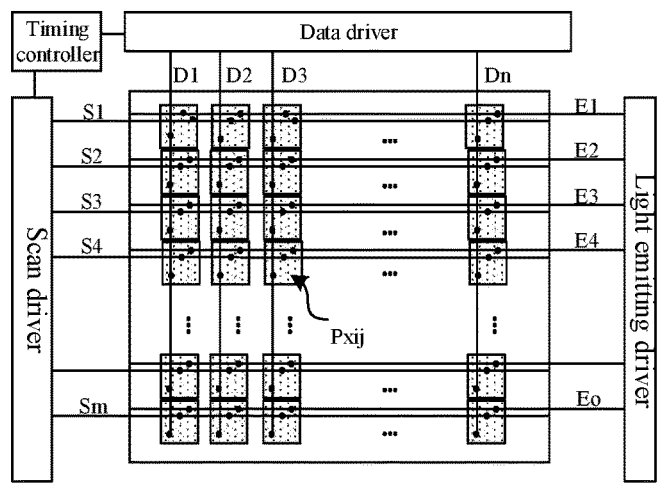
FIG. 1 is a schematic diagram of a structure of a display apparatus.

FIG. 1 is a schematic diagram of a structure of a display apparatus. As shown in FIG. 1, the display apparatus may include a timing controller, a data driver, a scan driver, a light emitting driver and a pixel array. The timing controller is connected to the data driver, the scan driver and the light emitting driver, respectively, the data driver is connected to a plurality of data signal lines (D1 to Dn) respectively, the scan driver is connected to a plurality of scan signal lines (S1 to Sm) respectively, and the light emitting driver is connected to a plurality of light emitting signal lines (E1 to Eo) respectively. The pixel array may include a plurality of sub-pixels Pxij, i and j may be natural numbers, at least one sub-pixel Pxij may include a circuit unit and a light emitting device connected to the circuit unit, and the circuit unit may include at least one scan signal line, at least one data signal line, at least one light emitting signal line and a pixel drive circuit. In an exemplary implementation, the timing controller may provide a gray tone value and a control signal, which are suitable for a specification of the data driver, to the data driver, provide a clock signal, a scan start signal, etc., which are suitable for a specification of the scan driver, to the scan driver, and provide a clock signal, a transmit stop signal, etc., which are suitable for a specification of the light emitting driver, to the light emitting driver. The data driver may generate a data voltage to be provided to the data signal lines D1, D2, D3, . . . , and Dn by using the gray tone value and the control signal that are received from the timing controller. For example, the data driver may sample the gray tone value by using the clock signal and apply a data voltage corresponding to the gray tone value to the data signal lines D1 to Dn by taking a pixel row as a unit, wherein n may be a natural number. The scan driver may receive the clock signal, the scan start signal, etc., from the timing controller to generate a scan signal to be provided to the scan signal lines S1, S2, S3, . . . , and Sm. For example, the scan driver may provide a scan signal with an on-level pulse to the scan signal lines S1 to Sm sequentially. For example, the scan driver may be constructed in a form of a shift register and may generate a scan signal in a manner in which the scan start signal provided in a form of an on-level pulse is transmitted to a next-stage circuit sequentially under the control of the clock signal, wherein m may be a natural number. The light emitting driver may receive a clock signal, a transmit stop signal, etc., from the timing controller to generate a transmit signal to be provided to the light emitting signal lines E1, E2, E3, . . . , and Eo. For example, the light emitting driver may provide a transmit signal with an off-level pulse to the light emitting signal lines E1 to Eo sequentially. For example, the light emitting driver may be constructed in a form of a shift register and may generate a transmit signal in a manner in which the transmit stop signal provided in a form of an off-level pulse is transmitted to a next-stage circuit sequentially under the control of the clock signal, wherein o may be a natural number.

Figure 2:
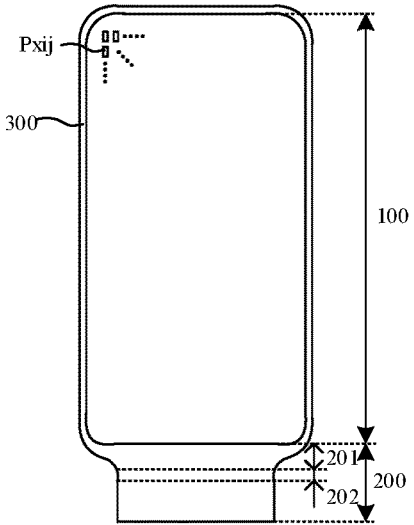
FIG. 2 is a schematic diagram of a structure of a display substrate.

FIG. 2 is a schematic diagram of a structure of a display substrate. As shown in FIG. 2, the display substrate may include a display region 100, a bonding region 200 at a side of the display region 100, and a bezel region 300 at other sides of the display region 100. In an exemplary implementation, the display region 100 may be a planar region including a plurality of sub-pixels Pxij that constitute a pixel array, the plurality of sub-pixels Pxij are configured to display a dynamic picture or a static image, and the display region 100 may be referred to as an active area (AA). In an exemplary implementation, the display substrate may be deformable, e.g., may be crimped, bent, folded, or curled.

In an exemplary implementation, a bonding region 200 may include a fan-out zone 201, a bending zone 202, a driver chip zone, and a bonding pin zone that are disposed sequentially along a direction away from the display region 100. The fan-out zone 201 is connected to the display region 100, and may at least include a data fan-out line, a high voltage power supply line and low voltage power supply line. The plurality of data fan-out line are configured to be connected with the data signal lines of the display region in a fan-out trace manner, the high voltage power supply line is configured to be connected with a first power supply line (VDD) of the display region 100, and the low voltage power supply line is configured to be connected with a second power supply line (VSS) of the bezel region 300. The bending zone 202 is connected to the fan-out zone 201 and may include a composite insulation layer provided with a groove, and is configured to bend the bonding region to the back of the display region. The driver chip zone may include an Integrated Circuit (IC for short) and is configured to be connected with the plurality of data fan-out lines. The bonding pin zone may at least include a plurality of bonding pads, and is configured to be bonded to and connected with an external Flexible Printed Circuit (FPC for short).

In an exemplary implementation, the bezel region 300 may include a circuit zone, a power supply line zone, and a crack dam zone and a cutting zone which are sequentially disposed along the direction away from the display region 100. The circuit zone is connected to the display region 100 and may at least include a gate drive circuit which is connected with a first scan line, a second scan line and a light emitting control line of a pixel drive circuit in the display region 100. The power supply line zone is connected to the circuit zone and may at least include a power supply lead line that extends along a direction parallel to the edge of the display region and is connected with a cathode in the display region 100. The crack dam zone is connected to the power supply line zone and may at least include a plurality of cracks disposed on the composite insulation layer. The cutting zone is connected to the crack dam zone and may at least include a cutting groove disposed on the composite insulation layer, and the cutting groove is used for cutting respectively along the cutting groove by a cutting device after all film layers of the display substrate are prepared.

In an exemplary implementation, the fan-out zone in the bonding region 200 and the power supply line zone in the bezel region 300 may be provided with a first isolation dam and a second isolation dam, the first isolation dam and the second isolation dam may extend in a direction parallel to the edge of the display region 100, thus forming an annular structure surrounding the display region 100, wherein the edge of the display region is an edge at a side of the display region close to the bonding region or the bezel region.

Figure 3:
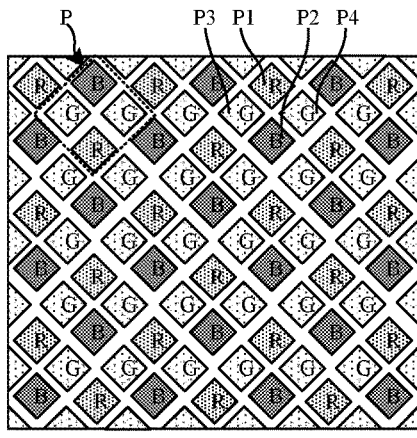
FIG. 3 is a schematic diagram of a planar structure of a display region in a display substrate.

FIG. 3 is a schematic diagram of a planar structure of a display region in a display substrate. As shown in FIG. 3, the display substrate may include a plurality of pixel units P arranged in a matrix. At least one pixel unit P includes a first sub-pixel P1 emitting light of a first color, a second sub-pixel P2 emitting light of a second color, a third sub-pixel P3 emitting light of a third color and a fourth sub-pixel P4 emitting light of a fourth color. Each sub-pixel may include a circuit unit and a light emitting device. The pixel drive circuit may at least include a pixel drive circuit which is connected with a scan signal line, a data signal line, and a light emitting signal line respectively. The pixel drive circuit is configured to receive a data voltage transmitted by the data signal line and output a corresponding current to the light emitting device under control of the scan signal line and the light emitting signal line. The light emitting device in each sub-pixel is connected with a pixel drive circuit of a sub-pixel where the light emitting device is located, and is configured to emit light with a corresponding brightness in response to a current output by the pixel drive circuit of the sub-pixel where the light emitting device is located.

In an exemplary implementation, the first sub-pixel P1 may be a red sub-pixel (R) emitting red light, the second sub-pixel P2 may be a blue sub-pixel (B) emitting blue light, and the third sub-pixel P3 and the fourth sub-pixel P4 may be green sub-pixels (G) emitting green light. In an exemplary implementation, the shape of the sub-pixel may be rectangle, diamond, pentagonal, hexagonal. The four sub-pixels may be arranged in a manner of diamond to form an RGBG pixel arrangement. In other exemplary implementations, the four sub-pixels may be arranged side by side horizontally, side by side vertically, or square-shaped manner, which is not limited in the present disclosure.

In an exemplary implementation, the pixel unit may include three sub-pixels, the three sub-pixels may be arranged in manner of horizontal juxtaposition, vertical juxtaposition or triangle, which is not limited in the present disclosure.

Figure 4:
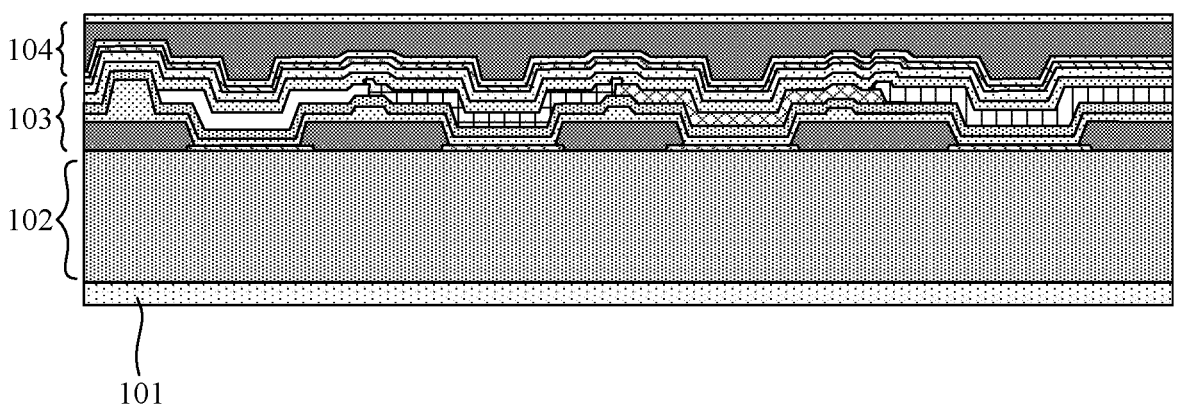
FIG. 4 is a schematic diagram of a sectional structure of a display region in a display substrate.

FIG. 4 is a schematic diagram of a sectional structure of a display region in a display substrate, illustrating a structure of four sub-pixels in the display region. As shown in FIG. 4, in a plane perpendicular to the display substrate, the display substrate may include a drive circuit layer 102 disposed on a base substrate 101, a light emitting structure layer 103 disposed at a side of the drive circuit layer 102 away from the base substrate 101, and an encapsulation structure layer 104 disposed at a side of the light emitting structure layer 103 away from the base substrate 101. In some possible implementations, the display substrate may include other film layers, such as a touch structure layer, which is not limited here in the present disclosure.

In an exemplary implementation, the base substrate 101 may be a flexible base substrate, or a rigid base substrate. The drive circuit layer 102 of each sub-pixel may include a pixel drive circuit composed of a plurality of transistors and storage capacitors. The light emitting element 103 of each sub-pixel may at least include an anode, a pixel definition layer, an organic light emitting layer and a cathode. The anode is connected with the pixel drive circuit of corresponding sub-pixel, the organic light emitting layer is connected with the anode, the cathode is connected with the organic light emitting layer, and the organic light emitting layer emits light of corresponding color under the drive of the anode and the cathode. The encapsulation layer 104 may include a first encapsulation layer, a second encapsulation layer, and a third encapsulation layer that are stacked, the first encapsulation layer and the third encapsulation layer may be made of an inorganic material, the second encapsulation layer may be made of an organic material, and the second encapsulation layer is disposed between the first encapsulation layer and the third encapsulation layer to form an inorganic material/organic material/inorganic material laminated structure and ensure that external water vapor cannot enter the light emitting structure layer 103.

In an exemplary implementation, the organic light emitting layer may include an emitting layer (EML), and any one or more of following layers: a hole injection layer (HIL), a hole transport layer (HTL), an electron block layer (EBL), a hole block layer (HBL), an electron transport layer (ETL), and an electron injection layer (EIL). In an exemplary implementation, one or more layers of hole injection layers, hole transport layers, electron block layers, hole block layers, electron transport layers, and electron injection layers of all sub-pixels may be a common layer communicated together. Emitting layers of adjacent sub-pixels may be overlapped slightly, or may be mutually isolated.

FIG. 5 is a schematic diagram of an equivalent circuit of a pixel drive circuit. In an exemplary implementation, the pixel drive circuit may have a structure of 3T1C, 4T1C, 5T1C, 5T2C, 6T1C, 7T1C or 8T1C. As shown in FIG. 5, the pixel drive circuit may include seven transistors (a first transistor T1 to a seventh transistor T7), one storage capacitor C. The pixel drive circuit is connected with seven signal lines (a data signal line D, a first scan signal line S1, a second scan signal line S2, a light emitting signal line E, an initial signal line INIT, a first power supply line VDD, and a second power supply line VSS) respectively.

In an exemplary implementation, the pixel drive circuit may include a first node N1, a second node N2, and a third node N3. Herein, the first node N1 is respectively connected with a first electrode of the third transistor T3, a second electrode of the fourth transistor T4, and a second electrode of the fifth transistor T5, the second node N2 is respectively connected with a second electrode of the first transistor, a first electrode of the second transistor T2, a control electrode of the third transistor T3, and a second end of the storage capacitor C, and the third node N3 is respectively connected with a second electrode of the second transistor T2, a second electrode of the third transistor T3, and a first electrode of the sixth transistor T6.

In an exemplary implementation, a first end of the storage capacitor C is connected with the first power supply line VDD, and the second end of the storage capacitor C is connected with the second node N2, i.e., the second end of the storage capacitor C is connected with the control electrode of the third transistor T3.

A control electrode of the first transistor T1 is connected with the second scan signal line S2, a first electrode of the first transistor T1 is connected with an initial signal line INIT, and the second electrode of the first transistor is connected with the second node N2. When a scan signal with an on-level is applied to the second scan signal line S2, the first transistor T1 transmits an initialization voltage to the control electrode of the third transistor T3 so as to initialize a charge amount of the control electrode of the third transistor T3.

A control electrode of the second transistor T2 is connected with the first scan signal line S1, the first electrode of the second transistor T2 is connected with the second node N2, and the second electrode of the second transistor T2 is connected with the third node N3. When a scan signal with an on-level is applied to the first scan signal line S1, the second transistor T2 enables the control electrode of the third transistor T3 to be connected with a second electrode of the third transistor T3.

The control electrode of the third transistor T3 is connected with the second node N2, i.e., the control electrode of the third transistor T3 is connected with the second end of the storage capacitor C, a first electrode of the third transistor T3 is connected with the first node N1, and the second electrode of the third transistor T3 is connected with the third node N3. The third transistor T3 may be referred to as a drive transistor, and the third transistor T3 determines an amount of a drive current flowing between the first power supply line VDD and the second power supply line VSS according to a potential difference between the control electrode and the first electrode of the third transistor T3.

A control electrode of the fourth transistor T4 is connected with the first scan signal line S1, a first electrode of the fourth transistor T4 is connected with the data signal line D, and a second electrode of the fourth transistor T4 is connected with the first node N1. The fourth transistor T4 may be referred to as a switch transistor, a scan transistor, etc., and when a scan signal with an on-level is applied to the first scan signal line S1, the fourth transistor T4 enables a data voltage of the data signal line D to be input to the pixel drive circuit.

A control electrode of the fifth transistor T5 is connected with the light emitting signal line E, a first electrode of the fifth transistor T5 is connected with the first power supply line VDD, and a second electrode of the fifth transistor T5 is connected with the first node N1. A control electrode of the sixth transistor T6 is connected with the light emitting signal line E, a first electrode of the sixth transistor T6 is connected with the third node N3, and a second electrode of the sixth transistor T6 is connected with a first electrode of a light emitting device. The fifth transistor T5 and the sixth transistor T6 may be referred to as light emitting transistors. When a light emitting signal with an on-level is applied to the light emitting signal line E, the fifth transistor T5 and the sixth transistor T6 enable the light emitting device to emit light by forming a drive current path between the first power supply line VDD and the second power supply line VSS.

A control electrode of the seventh transistor T7 is connected with the second scan signal line S2, a first electrode of the seventh transistor T7 is connected with the initial signal line INIT, and a second electrode of the seventh transistor T7 is connected with the first electrode of the light emitting device. When a scan signal with an on-level is applied to the second scan signal line S2, the seventh transistor T7 transmits an initialization voltage to the first electrode of the light emitting device so as to initialize a charge amount accumulated in the first electrode of the light emitting device or release a charge amount accumulated in the first electrode of the light emitting device.

In an exemplary implementation, the light emitting device may be an OLED including a first electrode (anode), an organic light emitting layer, and a second electrode (cathode), which are stacked, or may be a QLED including a first electrode (anode), a quantum dot light emitting layer, and a second electrode (cathode), which are stacked.

In an exemplary implementation, a second electrode of the light emitting device is connected with the second power supply line VSS, a signal of the second power supply line VSS is a low-level signal, and a signal of the first power supply line VDD is a high-level signal continuously provided. The first scan signal line S1 may be a scan signal line in a pixel drive circuit of a current display row, and the second scan signal line S2 may be a scan signal line in a pixel drive circuit of a previous display row. That is, for an n-th display row, the first scan signal line S1 is S(n), and the second scan signal line S2 is S(n–1). The second scan signal line S2 of the current display row and the first scan signal line S1 in the pixel drive circuit of the previous display row are the same signal line, thus signal lines of the display panel may be reduced, so that a narrow bezel of the display panel is achieved.

In an exemplary implementation, the first transistor T1 to the seventh transistor T7 may be P-type transistors or N-type transistors. Use of a same type of transistors in a pixel drive circuit may simplify a process flow, reduce process difficulties of a display panel, and improve a product yield. In some possible implementations, the first transistor T1 to the seventh transistor T7 may include P-type transistors and N-type transistors.

In an exemplary implementation, the first transistor T1 to the seventh transistor T7 may be low temperature poly silicon thin film transistors, or may be oxide thin film transistors, or may be low temperature poly silicon thin film transistors and oxide thin film transistors. An active layer of a low temperature poly silicon thin film transistor may be made of Low Temperature Poly Silicon (LTPS for short), and an active layer of an oxide thin film transistor may be made of an oxide semiconductor (Oxide). The low temperature polysilicon thin film transistor has advantages such as high migration rate and fast charging. The oxide thin film transistor has advantages such as low drain current. The low temperature polysilicon thin film transistor and the oxide thin film transistor are integrated on one display substrate to form a Low Temperature Polycrystalline Oxide (LTPO for short) display substrate, so that advantages of the low temperature polysilicon thin film transistor and the oxide thin film transistor can be utilized, low-frequency drive can be realized, power consumption can be reduced, and display quality can be improved.

FIG. 6 is a working timing diagram of a pixel drive circuit. An exemplary embodiment of the present disclosure will be described below through a working process of the pixel drive circuit exemplified in FIG. 5. The pixel drive circuit in FIG. 5 includes seven transistors (a first transistor T1 to a seventh transistor T7) and one storage capacitor C, and the seven transistors are all P-type transistors.

In an exemplary implementation, taking an OLED as example, the working process of the pixel drive circuit may include the following stages.

In a first stage A1, referred to as a reset stage, a signal of the second scan signal line S2 is a low-level signal, and signals of the first scan signal line S1 and the light emitting signal line E are high-level signals. The signal of the second scan signal line S2 is a low-level signals, which causes the first transistor T1 and the seventh transistor T7 to be turned on. The first transistor T1 is turned on such that the initial voltage of the initial signal line INIT is provided to a second node N2 to initialize the storage capacitor C to clear an original data voltage in the storage capacitor. The seventh transistor T7 is turned on, so that an initialization voltage of the initial signal line INIT is provided to a first electrode of the OLED to initialize (reset) the first electrode of the OLED and clear a pre-stored voltage therein, thereby completing initialization. The signals of the first scan signal line S1 and the light emitting signal line E are high-level signals, so that the second transistor T2, the fourth transistor T4, the fifth transistor T5 and the sixth transistor T6 are turned off. An OLED does not emit light in this stage.

In a second stage A2, referred to as a data writing stage or a threshold compensation stage, the signal of the first scan signal line S1 is a low-level signal, signals of the second scan signal line S2 and the light emitting signal line E are high-level signals, and the data signal line D outputs a data voltage. In this stage, a second end of the storage capacitor C is at a low level, so the third transistor T3 is turned on. The signal of the first scan signal line S1 is a low-level signal, so that the second transistor T2 and the fourth transistor T4 are turned on. The second transistor T2 and the fourth transistor T4 are turned on, so that the data voltage output by the data signal line D is provided to the second node N2 through a first node N1, the turned-on third transistor T3, a third node N3, and the turned-on second transistor T2, and the storage capacitor C is charged with a difference between the data voltage output by the data signal line D and a threshold voltage of the third transistor T3. A voltage at the second end (the second node N2) of the storage capacitor C is Vd−|Vth|, wherein Vd is the data voltage output by the data signal line D, and Vth is the threshold voltage of the third transistor T3. The signal of the second scan signal line S2 is the high-level signal, so that the first transistor T1 and the seventh transistor T7 are turned off. The signal of the light emitting signal line E is a high-level signal, so that the fifth transistor T5 and the sixth transistor T6 are turned off.

In a third stage A3, referred to as a light emitting stage, the signal of the light emitting signal line E is a low-level signal, and the signals of the first scan signal line S1 and the second scan signal line S2 are high-level signals. The signal of the light emitting signal line E is a low-level signal, so that the fifth transistor T5 and the sixth transistor T6 are turned on, and a power voltage output by the first power supply line VDD provides a drive voltage to the first electrode of the OLED through the turned-on fifth transistor T5, third transistor T3, and sixth transistor T6 to drive the OLED to emit light.

In a drive process of the pixel drive circuit, a drive current flowing through the third transistor T3 (drive transistor) is determined by a voltage difference between a gate electrode and a first electrode of the third transistor T3. The voltage of the second node N2 is Vdata−|Vth|, so the drive current of the third transistor T3 is as follows.

$$I = K*(Vgs - Vth)^2 = K*[(Vdd - Vd + |Vth|) - Vth]^2 = K*[(Vdd - Vd]^2$$

Herein, I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power voltage output by the first power supply line VDD.

With the development of OLED display technologies, consumers have higher requirements on the display effect of display products. Super-narrow bezels have become a new trend in the development of display products. Therefore, bezel narrowing or even a bezel-less design has received more attention in the design of OLED display products. Since the signal lines of integrated circuits and bonding pads in the bonding region need to be fanned out through data fan-out lines to be led into a wider display region, the fan-out region occupies a larger space, resulting in a larger width of the lower bezel.

An exemplary embodiment of the present disclosure provides a display substrate, which adopts a structure in which the data fan-out line is located in the display region (fan-out in AA, abbreviated as FIAA). Ends of a plurality of data fan-out lines are located in the display region and are correspondingly connected with a plurality of data signal lines in the display region. The other ends of the plurality of data fan-out lines extend to the bonding region and are correspondingly connected with the integrated circuit. Since the bonding region does not need to be provided with fan-shaped oblique lines, the width of the fan-out zone is reduced, and the width of the lower bezel is effectively reduced.

In an exemplary implementation, the display substrate may include a display region, the display region may include a plurality of sub-pixels, at least one sub-pixel may include a circuit unit disposed on the base substrate, the circuit unit may at least include a pixel drive circuit and a data signal line, the pixel drive circuit is connected with the data signal line. The base substrate may include a first flexible layer, a second flexible layer, and a base substrate conductive layer disposed between the first flexible layer and the second flexible layer. The base substrate conductive layer of at least one sub-pixel may at least include a data fan-out line, and the data signal line is connected with the data fan-out line through a lapping via.

In an exemplary implementation, the display region includes a plurality of pixel rows sequentially disposed along a second direction, each pixel row includes a plurality of sub-pixels sequentially disposed along a first direction, the second direction is an extension direction of the data signal line, the first direction intersects with the second direction. The display region is provided with a lapping zone at a middle portion in the second direction, the lapping zone includes at least one pixel row, and the lapping via is disposed in at least one sub-pixel of the lapping zone.

In an exemplary implementation, the pixel drive circuit of the circuit unit includes a lapping electrode connected with the data fan-out line through a first lapping via, and the data signal line connected with the lapping electrode through a second lapping via.

In an exemplary implementation, at least one sub-pixel further includes a light emitting device disposed at a side of the circuit unit away from the base substrate, the light emitting device at least includes an anode, and the anode is connected with the pixel drive circuit through an anode via, and an orthographic projection of the first lapping via in a plane of the display substrate is not overlapped with an orthographic projection of the anode via in the plane of the display substrate.

In an exemplary implementation, the light emitting device further includes a pixel definition layer on which a pixel opening is provided, the pixel opening exposes the anode; an orthographic projection of the pixel opening in the plane of the display substrate is not overlapped with the orthographic projection of the anode via in the plane of the display substrate, and the orthographic projection of the pixel opening in the plane of the display substrate is not overlapped with the orthographic projection of the first overlapping via in the plane of the display substrate.

In an exemplary implementation, in a plane perpendicular to the plane of the display substrate, the circuit unit may include a first insulation layer, a semiconductor layer, a second insulation layer, a first conductive layer, a third insulation layer, a second conductive layer, a fourth insulation layer, a third conductive layer, a fifth insulation layer, a first planarization layer, a fourth conductive layer and the second planarization layer which are sequentially disposed on the base substrate. The semiconductor layer at least includes an active layer of a plurality of transistors, the first conductive layer at least includes gate electrodes of a plurality of transistors and a first plate of a storage capacitor, the second conductive layer at least includes a lapping electrode and a second plate of the storage capacitor, the third conductive layer at least includes the data signal line, and the fourth conductive layer at least includes an anode connection electrode.

In another exemplary embodiment, in a plane perpendicular to the display substrate, the pixel drive circuit includes a first insulation layer, a first semiconductor layer, a second insulation layer, a first conductive layer, a third insulation layer, a second conductive layer, a fourth insulation layer, a second semiconductor layer, a fifth insulation layer, a third conductive layer, a sixth insulation layer, a fourth conductive layer, a seventh insulation layer, a first planarization layer, a fifth conductive layer and a second planarization layer which are disposed sequentially on the base substrate. The first semiconductor layer at least includes an active layer of a plurality of low temperature polysilicon transistors, the first conductive layer at least includes gate electrodes of a plurality of low temperature polysilicon transistors and a first plate of a storage capacitor, the second conductive layer at least includes lower gate electrodes of the oxide transistors and a second plate of the storage capacitor, the second semiconductor layer at least includes active layers of oxide transistors, the third conductive layer at least includes a lapping electrode and upper gate electrodes of the oxide transistors, the fourth conductive layer at least includes the data signal line, and the fifth conductive layer at least includes an anode connection electrode.

FIG. 7 is a schematic diagram of a planar structure of a display substrate according to an exemplary embodiment of the present disclosure in which data fan-out lines in the display substrate adopts a FIAA structure. In a plane parallel to the display substrate, the display substrate may include a display region 100, a bonding region 200 located at a side of the display region 100, and a bezel region 300 located at other sides of the display region 100, the display region 100 may at least include a plurality of data signal lines 60, a plurality of data fan-out lines 70, and a plurality of sub-pixels constituting a pixel array, and the bonding region 200 may at least include a lead line zone 210 and a bending zone 202, and the lead line zone 210 may include a plurality of lead lines 220 parallel to each other.

In an exemplary implementation, the plurality of sub-pixels of the pixel array may include a plurality of pixel rows and a plurality of pixel columns. Each pixel row may include a plurality of sub-pixels sequentially disposed along a first direction X, the plurality of pixel rows may be sequentially disposed along a second direction Y, and each pixel column may include a plurality of sub-pixels sequentially disposed along the second direction Y, the plurality of pixel columns may be sequentially disposed along he first direction X, and the first direction X intersects with the second direction Y. In an exemplary implementation, the second direction Y may be an extension direction of the data signal line (vertical direction), and the first direction X may be perpendicular to the second direction Y.

In an exemplary implementation, the data signal lines 60 may be in a line shape extending along the second direction Y, and a plurality of data signal lines 60 are sequentially disposed with a predefined interval in the first direction X, each data signal line 60 is connected with a pixel drive circuit of a circuit unit in one pixel column.

In an exemplary implementation, first ends of the plurality of data fan-out lines 70 are connected correspondingly with the plurality of lead lines 220 in the lead line zone 210, the second ends of the plurality of data fan-out lines 70 are correspondingly connected with the plurality of data signal lines 60 through a plurality of lapping vias K after extending towards a direction away from the bonding region 200 in the display region 10, so that the plurality of data signal lines 60 in the display region 100 are correspondingly connected with the plurality of lead lines 220 in the bonding region 200 through the plurality of data fan-out lines 70 in the display region 100.

In the present disclosure, "A extends in a B direction" means that A may include a main portion, which is a line, a line segment or a strip-shaped body, and a secondary portion connected with the main portion, the main portion extends in the B direction, and a length of the main portion extending in the B direction is greater than a length of the secondary portion extending in another direction. In the following description, "A extends in a B direction" means "the main body portion of A extends in a B direction". In an exemplary implementation, the second direction Y may be a direction pointing to the bonding region from the display region, and the opposite direction of the second direction Y may be a direction pointing to the display region from the bonding region.

In an exemplary implementation, the quantity of data fan-out lines in the display region may be the same as the quantity of data signal lines, each of the data signal lines is correspondingly connected with one of the lead lines through one of the data fan-out lines. Alternatively, the quantity of data fan-out lines in the display region may be less than the quantity of data signal lines, and a part of the data signal lines in the display region are connected with the lead lines correspondingly through the data fan-out lines, and the other part of the data signal lines are directly connected with the lead lines, which is not limited in the present disclosure.

In an exemplary implementation, the display region 100 can be divided into a normal pixel zone 110 and a trace pixel zone according to the presence or absence of the data fan-out lines 70. The normal region 110 may be a region in which the data fan-out lines 70 are not provided, and the trace pixel zone may be a region in which the data fan-out lines 70 are provided.

In an exemplary implementation, the trace pixel zone 120 may be located in the middle of the display region 100 in the first direction X and may include a trace zone 120A and a lapping zone 120B connected with each other. The trace zone 120A may be shaped as a strip shape extending along the second direction Y, and the lapping zone 120B may be shaped as a strip shape extending along the first direction X. The lapping zone 120B is disposed at a side of the trace zone 120A away from the bonding region 200, and the trace zone 120A and the lapping zone 120B constitute a "T" shape.

In an exemplary implementation, the strip-shaped trace zone 120A may be in a rectangular shape, alternatively, the strip-shaped trace zone 120A may be in a trapezoid shape.

In an exemplary implementation, the lapping zone 120B may be located at a middle portion of the display region in the second direction Y, the lapping zone 120B may include at least one pixel row, and the lapping vias K may be disposed within at least one sub-pixel of the lapping zone 120B.

In an exemplary implementation, the lapping vias K may be disposed within a plurality of sub-pixels of one pixel row in the lapping zone 120B, alternatively, the lapping vias K may be disposed within a plurality of sub-pixels of a plurality of pixel rows in the lapping zone 120B. In an exemplary implementation, at least part of the data signal lines 60 are connected with the data fan-out lines 70 through the lapping vias K located in the lapping zone 120B.

In an exemplary implementation, the lapping zone 120B may be located in a region of the display region proximate to a first center line O1, and the trace zone 120A may be located in a middle region of the display region 100 in the first direction X and extend along the second direction Y to the edge of the display region to be connected with the bonding region 200. In an exemplary implementation, the first center line O1 may be a straight line that bisects a plurality of pixel rows in the second direction Y and extends along the first direction X, and the edge of the display region is an edge of a side of the display region 100 close to the bonding region 200.

In an exemplary implementation, a plurality of lapping vias K may be disposed in the lapping zone 120B, i.e. a plurality of lapping vias K may be respectively disposed within a plurality of sub-pixels close to the first center line O1.

In an exemplary implementation, the lapping zone 120B may include 1 to 3 pixel rows close to the first center line O1, and the plurality of lapping vias K may be disposed within sub-pixels of the 1 to 3 pixel rows close to the first center line O1. For example, the pixel rows included in the lapping zone 120B may be any one or more of the following pixel rows: a first center pixel row located at a side of the first center line O1 in the second direction Y or a side of the first center line O1 in the opposite direction of the second direction Y, a second center pixel row located at a side of the first center pixel row away from the first center line O1, and a third center pixel row located at a side of the second center pixel row away from the first center line O1. The plurality of lapping vias K may be disposed in sub-pixels of any one or more of the following pixel rows: the first center pixel row, the second center pixel row, and the third center pixel row.

In an exemplary embodiment of the present disclosure, it can be ensured that a voltage drop of a data voltage received by a sub-pixel close to the bonding region is substantially similar to a voltage drop of a data voltage received by a sub-pixel away from the bonding region by disposing the lapping vias in the middle region of the display region, thus improving the display quality. By disposing the lapping vias in the sub-pixels of the middle region of the display region according to the present disclosure, not only the etching uniformity may be ensured, but also the connection reliability may be improved.

In an exemplary implementation, the normal pixel zone 110 may be provided with a power supply electrode 80. The power supply electrode 80 may be disposed in an region other than the data fan-out lines 70 and may be respectively connected with a power supply lead line of the bonding region 200 and a power supply lead line of the bezel region 300 and may be configured to transmit a low-voltage power supply signal or a high-voltage power supply signal to reduce a voltage drop of the power supply signal and reduce power consumption.

In an exemplary implementation, the power supply electrode 80 may be of a planar structure. The planar structure may be a complete plane, or may be a plane with a hollow pattern, or may be a mesh structure, which is not limited in the present disclosure.

By disposing the lapping vias in the middle region of the display region according to the present disclosure, the area of the trace pixel zone 120 is relatively small and the area of the normal pixel zone 110 is relatively large, so that the power supply electrode with a planar structure can be disposed in a relatively large space, thus increasing the area of the power supply electrode and minimizing the voltage drop of the power supply signal transmitted by the power supply electrode.

In an exemplary implementation, in a plane perpendicular to the display substrate, at least one sub-pixel may include a circuit unit disposed on the base substrate and a light emitting device disposed at a side of the circuit unit away from the base substrate, the base substrate may include a first flexible layer, a second flexible layer, and a base substrate conductive layer disposed between the first flexible layer and the second flexible layer, the base substrate conductive layer of at least one sub-pixel may include a data fan-out line, the base substrate conductive layer of at least one sub-pixel may include a power supply electrode, the circuit unit may at least include a pixel drive circuit and a data signal line, and the light emitting device may at least include an anode, an organic light emitting layer and a cathode, wherein the anode is connected with the pixel drive circuit of the sub-pixel where it is located through an anode via.

FIG. 8 is a diagram of planar structure of a trace pixel zone according to an exemplary embodiment of the present disclosure, illustrating a planar structure of 8 sub-pixels (2 pixel rows, 4 pixel columns) of the region A in FIG. 7. As shown in FIG. 7 and FIG. 8, at least one sub-pixel of the lapping zone 120B in the trace pixel zone 120 may include a circuit unit and a light emitting device disposed on the base substrate, the base substrate may at least include a data fan-out line 70, the circuit unit may at least include a pixel drive circuit and a data signal line 60, the ata signal line 60 is connected with the pixel drive circuit, and the data fan-out line 70 is connected with the data signal line 60. The light emitting device may at least include an anode 301 and a pixel definition layer on which a pixel opening PV is provided, and the pixel opening PV exposes a surface of the anode 301.

In an exemplary implementation, the pixel drive circuit may include a lapping electrode 33, the lapping electrode 33 is connected with the data fan-out line 70 through a first lapping via DV1, and the data signal line 60 is connected with the lapping electrode 33 through a second lapping via DV2, thereby achieving the connection of the data signal line 60 with the data fan-out line 70 through the lapping via.

In an exemplary implementation, the pixel drive circuit may include an anode connection electrode 51, the anode 301 is connected with the anode connection electrode 51 through an anode via AV.

FIG. 9 is a schematic diagram of a positional relationship of the first lapping via, the anode via and the pixel opening in the structure shown in FIG. 8; As shown in FIG. 9, in at least one sub-pixel, an orthographic projection of the first lapping via DV1 in the plane of the display substrate is not overlapped with an orthographic projection of the anode via AV in the plane of the display substrate, an orthographic projection of the first lapping via DV1 in the plane of the display substrate is not overlapped with an orthographic projection of the pixel opening PV in the plane of the display substrate, and the orthographic projection of the anode via AV in the plane of the display substrate is not overlapped with the orthographic projection of the pixel opening PV in the plane of the display substrate.

In an exemplary implementation, a first distance L1 between an edge of a side of the anode via AV close to the first lapping via DV1 and an edge of a side of the first lapping via DV1 close to the anode via AV may be greater than or equal to 2.5 μm, and the first distance L1 may be a minimum distance between the anode via AV and the first lapping via DV1.

In an exemplary implementation, in at least one sub-pixel, a second distance L2 between an edge of a side of the pixel opening PV close to the anode via AV and an edge of a side of the anode via AV close to the pixel opening PV may be greater than or equal to 3.0 μm, and the second distance L2 may be a minimum distance between the pixel opening PV and the anode via AV.

In an exemplary implementation, in at least one sub-pixel, a third distance L3 between an edge of a side of the pixel opening PV close to the first lapping via DV1 and an edge of a side of the first lapping via DV1 close to the pixel opening PV may be greater than or equal to 2.5 μm, and the third distance L3 may be a minimum distance between the pixel opening PV and the first lapping via DV1.

Exemplary description is made below through a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a base substrate through a process such as deposition, coating, etc. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern". "A and B being disposed on a same layer" mentioned in the present disclosure means that A and B are formed simultaneously through a same patterning process, and a "thickness" of a film layer is a dimension of the film layer in a direction perpendicular to a display substrate. In an exemplary implementation of the present disclosure, "an orthographic projection of B is within a range of an orthographic projection of A" or "an orthographic projection of A includes an orthographic projection of B" refers to that a boundary of the orthographic projection of B falls within a range of a boundary of the orthographic projection of A, or the boundary of the orthographic projection of A is overlapped with the boundary of the orthographic projection of B.

In an exemplary implementation, taking 8 sub-pixels (2 pixel rows, 4 pixel columns) of the region A in FIG. 7 as an example, the preparation process of the display substrate may include the following operations.

(1) Preparing a base substrate on a glass carrier plate. In an exemplary implementation, preparing a base substrate on a glass carrier may include: a layer of a first flexible material is coated on the glass carrier at first, and a first flexible layer is formed after cured into film. Then a barrier thin film and a base substrate conductive film are sequentially deposited on the first flexible layer, and the base substrate conductive film is patterned by a patterning process to form a barrier layer covering the first flexible layer and a pattern of the base substrate conductive layer disposed on the barrier layer. A second flexible material is then coated and cured into film to form a second flexible layer covering the pattern of the base substrate conductive layer, as shown in FIG. 10. In an exemplary implementation, the base substrate conductive layer may be referred to as a 0th source drain metal (SD0) layer.

In an exemplary implementation, the pattern of the base substrate conductive layer of each sub-pixel may at least include a data fan-out line 70.

In an exemplary implementation, the shape of the data fan-out line 70 may be a line shape of which the main body portion extends along the second direction Y, and the data fan-out line 70 in the N-th sub-pixel column may be located at a side of the present sub-pixel away from the (N+1)th sub-pixel column.

In an exemplary implementation, the data fan-out line 70 of each sub-pixel is provided with a connection block 71, which may be of an "I" shape or an "L" shape, a first end of the connection block 71 is connected with the data fan-out line 70, and a second end of the connection block 71 extends to the middle of the sub-pixel along the first direction X. In an exemplary implementation, the data fan-out line 70 is configured to be connected with the lead line of the bonding region and the connection block 71 is configured to be connected with a lapping electrode formed subsequently through the first lapping via.

In an exemplary implementation, the positions and shapes of the data fan-out lines 70 of each sub-pixel may be substantially similar, and the shapes and dimensions of the connection blocks 71 of each sub-pixel may be different. For example, the shapes of the connection blocks 71 in the sub-pixel of (N−1)th column and M-th row and the sub-pixel of (N+1)th column and M-th row are "L" shaped, but the extension dimensions of the two in the second direction Y are different. As another example, the shapes of the connection blocks 71 in the sub-pixel of N-th column and M-th row and the sub-pixel of (N+2)th column and the M-th row are "I" shaped, but the extension dimensions of the two in the first direction X are different.

In an exemplary implementation, the material of the first flexible layer and the second flexible layer may include, but not limited to, one or more of polyethylene glycol terephthalate, polyethylene terephthalate, polyether-ether-ketone, polystyrene, polycarbonate, polyarylate, polyarylester, polyimide, polyvinyl chloride, polyethylene, and textile fibers. The material of the barrier layer may include, but is not limited to, any one or more of a silicon oxide (SiOx), a silicon nitride (SiNx), and a silicon oxynitride (SiON), and it may be a single layer, a multi-layer, or a composite layer for improving the water-oxygen resistance of the base substrate. The base substrate conductive layer may be made of a metal material, such as any one or more of silver (Ag), copper (Cu), aluminum (Al), and molybdenum (Mo), or an alloy material of the aforementioned metals.

(2) Forming a pattern of a semiconductor layer. In an exemplary implementation, forming a pattern of a semiconductor layer may include: depositing sequentially a first insulating thin film and a semiconductor thin film on a base substrate, and patterning the semiconductor thin film through a patterning process to form a first insulation layer covering the base substrate and a semiconductor layer disposed on the first insulation layer, as shown in FIG. 11a and FIG. 11*b*, and FIG. 11*b* is a planar schematic diagram of the semiconductor layer in FIG. 11*a*.

In an exemplary implementation, the pattern of the semiconductor layer of each sub-pixel may at least include a first active layer 11 of the first transistor T1 to a seventh active layer 17 of the seventh transistor T7, and the first active layer 11 to the seventh active layer 17 are of an integral structure connected with one another. In the second direction Y, the sixth active layer 16 in the sub-pixels of M-th row and the seventh active layer 17 in the sub-pixels of (M+1)th row are connected with each other.

In an exemplary implementation, in the first direction X, the second active layer 12 and the sixth active layer 16 may be located at the same side of the third active layer 13 in the present sub-pixel, the fourth active layer 14 and the fifth active layer 15 may be located at the same side of the third active layer 13 in the present sub-pixel, and the second active layer 12 and the fourth active layer 14 may be located at different sides of the third active layer 13 of the present sub-pixel. In the second direction Y, the first active layer 11, the second active layer 12, and the fourth active layer 14, and the seventh active layer 17 in the sub-pixels of M-th row may be located at a side of the third active layer 13 of the present sub-pixel away from the sub-pixels of (M+1)th row, and the fifth active layer 15 and the sixth active layer 16 in the sub-pixels of M-th row may be located at a side of the third active layer 13 of the present sub-pixel close to the sub-pixels of (M+1)th row.

In an exemplary implementation, the first active layer 11 may be in an "n" shape, the second active layer 12 and the fifth active layer 15 may be in a "L" shape, the third active layer 13 may be in an "Ω" shape, the fourth active layer 14, the fifth active layer 15, the sixth active layer 16 and the seventh active layer 17 may be in an "I" shape.

In an exemplary implementation, an active layer of each transistor may include a first zone, a second zone, and a channel region located between the first zone and the second zone. In an exemplary implementation, a first zone 11-1 of the first active layer 11 may serve as a first zone 17-1 of the seventh active layer 17; a second zone 11-2 of the first active layer 11 may serve as a first zone 12-1 of the second active layer 12; a first zone 13-1 of the third active layer 13 may serve as a second zone 14-2 of the fourth active layer 14 and a second zone 15-2 of the fifth active layer 15 simultaneously; a second zone 13-2 of the third active layer 13 may serve as a second zone 12-2 of the second active layer 12 and a first zone 16-1 of the sixth active layer 16 simultaneously; a second zone 16-2 of the sixth active layer 16 may serve as a second zone 17-2 of the seventh active layer 17; a first zone 14-1 of the fourth active layer 14 and a first zone 15-1 of the fifth active layer 15 may be separately provided.

In an exemplary implementation, an orthographic projection of the first zone 14-1 of the fourth active layer 14 on the base substrate is at least partially overlapped with an orthographic projection of the data fan-out line 70 on the base substrate.

(3) Forming a pattern of a first conductive layer. In an exemplary implementation, forming a pattern of a first conductive layer may include: sequentially depositing a second insulating thin film and a first conductive thin film on the base substrate on which the above-mentioned pattern is formed, and patterning the first conductive thin film through a patterning process to form a second insulation layer that covers a pattern of the semiconductor layer and form a pattern of the first conductive layer disposed on the second insulation layer, as shown in FIG. 12*a* and FIG. 12*b*, and FIG. 12*b* is a planar schematic diagram of the first conductive layer in FIG. 12*a*. In an exemplary implementation, the first conductive layer may be referred to as a first gate metal (GATE1) layer.

In an exemplary implementation, the pattern of the first conductive layer of each sub-pixel may at least include the first scanning signal line 21, the second scanning signal line 22, the light emitting control line 23, the first plate 24 of the storage capacitor.

In an exemplary implementation, the first plate 24 may be in a shape of a rectangle, and chamfers may be provided at corners of the rectangle. An orthographic projection of the first plate 24 on the base substrate is at least partially overlapped with an orthographic projection of the third active layer of the third transistor T3 on the base substrate. In an exemplary implementation, the first plate 24 may serve as a plate of the storage capacitor and a gate electrode of the third transistor T3 simultaneously.

In an exemplary implementation, the first scan signal line 21 may be of a line shape of which the main body portion extends along the first direction X, and the first scan signal line 21 in the sub-pixels of M-th row may be located at a side of the first plate 24 of the present sub-pixel away from the sub-pixels of (M+1)th row. The first scan signal line 21 of each sub-pixel is provided with a gate block 21-1, a first end of the gate block 21-1 is connected with the first scan signal line 21, and a second end of the gate block 21-1 extends towards a direction away from the first plate 24. A region where the first scan signal line 21 and the gate block 21-1 are overlapped with the second active layer of the present sub-pixel serves as a gate electrode of the second transistor T2 of a double-gate structure, and a region where the first scan signal line 21 is overlapped with the fourth active layer of the present sub-pixel serves as a gate electrode of the fourth transistor T4.

In an exemplary implementation, the second scan signal line 22 may be of a line shape of which the main body portion extends along the first direction X, the second scan signal line 22 in the M-th row sub-pixel may be located at a side of the first scan signal line 21 of the present sub-pixel away from the first plate 24, a region where the second scan signal line 22 is overlapped with the first active layer of the present sub-pixel serves as a gate electrode of the first transistor T1 of a double-gate structure, and a region where the second scan signal line 22 is overlapped with the seventh active layer of the present sub-pixel serves as a gate electrode of the seventh transistor T7.

In an exemplary implementation, the light emitting control line 23 may be of a line shape of which the main body portion extends along the first direction X, the light emitting control line 23 may be located at a side of the first plate 24 of the present sub-pixel close to the sub-pixels of (M+1)th row, a region where the light emitting control line 23 is overlapped with the fifth active layer of the present sub-pixel serves as a gate electrode of the fifth transistor T5, and a region where the light emitting control line 23 is overlapped with the sixth active layer of the present sub-pixel serves as a gate electrode of the sixth transistor T6.

In an exemplary implementation, the first scan signal line 21, the second scan signal line 22, and the light emitting control line 23 may be in an equal width design, or may be in a non-equal width design, may be straight lines, or may be polygonal lines, which may not only facilitate the layout of the pixel structure, but also reduce the parasitic capacitance between the signal lines, and this is not limited in the present disclosure.

In an exemplary implementation, after the pattern of the first conductive layer is formed, the semiconductor layer may be subjected to a conductive treatment by using the first conductive layer as a shield. A region of the semiconductor layer, which is shielded by the first conductive layer, forms channel regions of the first transistor T1 to the seventh transistor T7, and a region of the semiconductor layer, which is not shielded by the first conductive layer, is made to be conductive, that is, first zones and second zones of the first transistor T1 to the seventh transistor T7 are all made to be conductive.

(4) Forming a pattern of a third insulation layer. In an exemplary implementation, forming a pattern of a third insulation layer may include: depositing a third insulating thin film on the base substrate on which the aforementioned patterns are formed, and patterning the third insulating thin film by a patterning process, to form a third insulation layer covering the first conductive layer, wherein a plurality of vias are disposed on the third insulation layer, as shown in FIG. 13.

In an exemplary implementation, the plurality of vias of each sub-pixel at least include a first lapping via DV1. An orthographic projection of the first lapping via DV1 on the base substrate is within a range of an orthographic projection of the connection block 71 of the data fan-out line 70 on the base substrate. The third insulation layer, the second insulation layer, the first insulation layer and the second flexible layer in the first lapping via DV1 are removed to expose a surface of the connection block 71. The first lapping via DV1 is configured to connect a lapping electrode formed subsequently with the connection block 71 through the via.

(5) Forming a pattern of a second conductive layer. In an exemplary implementation, forming a pattern of a second conductive layer may include: depositing a second conductive thin film on the base substrate on which the above-mentioned patterns are formed, and patterning the second conductive thin film through a patterning process to form a pattern of the second conductive layer on the third insulation layer, as shown in FIG. 14a and FIG. 14b, and FIG. 14b is a planar schematic diagram of the second conductive layer in FIG. 14a. In an exemplary implementation, the second conductive layer may be referred to as a second gate metal (GATE2) layer.

In an exemplary implementation, the second conductive layer pattern of each sub-pixel at least includes an initial signal line 31, a second plate 32 of a storage capacitor, a lapping electrode 33, and a shield electrode 34.

In an exemplary implementation, a profile of second plate 32 may be in the shape of a rectangle, chamfers may be provided at corners of the rectangle. An orthographic projection of the second plate 32 on the base substrate is at least partially overlapped with an orthographic projection of the first plate 24 on the base substrate. The second plate 32 may serve as another plate of the storage capacitor, and the first plate 24 and the second plate 32 form the storage capacitor of the pixel drive circuit. The second plate 32 is provided with an opening 35 which may be rectangular and may be located in the middle of the second plate 32, so that the second plate 32 forms an annular structure. The opening 35 exposes the third insulation layer covering the first plate 24, and the orthographic projection of the first plate 24 on the base substrate contains an orthographic projection of the opening 35 on the base substrate. In an exemplary implementation, the opening 35 is configured to accommodate a first via formed subsequently, which is located in the opening 35 and exposes the first plate 24, so that a second electrode of the first transistor T1 formed subsequently is connected with the first plate 24.

In an exemplary implementation, the second plates 32 of two adjacent sub-pixels in one sub-pixel row are connected with each other by a plate connection line 36. For example, the second plate 32 of the (N−1)th column and the second plate 32 of the N-th column may be connected with each other by the plate connection line 36. As another example, the second plate 32 of the N-th row and the second plate 32 of the (N+1)th row are connected with each other by the plate connection line 36. In some exemplary implementations, since the second plate 32 in each sub-pixel is connected with a first power supply line formed subsequently, by forming an integral structure connected with each with adjacent second plates 32, the second plates in the integral structure may be reused as power supply signal lines, it may be ensured that a plurality of second plates in one sub-pixel row have a same potential, which is beneficial to improving uniformity of the panel and avoiding a poor display of the display substrate, thereby ensuring a display effect of the display substrate.

In an exemplary implementation, the initial signal line 31 may be of a line shape of which the main body portion extends along the first direction X. The initial signal line 31 in the sub-pixels of M-th row may be located at a side of the second scan signal line 221 of the present sub-pixel away from the sub-pixels of (M+1)th row, and the initial signal line 31 is configured to be connected with the first zone of the first active layer (also the first zone of the seventh active layer) through a first electrode of the first transistor T1 (also a first electrode of the seventh transistor T7) which is formed subsequently.

In an exemplary implementation, the lapping electrode 33 may include a first lapping portion 33-1 and a second lapping portion 33-2 connected with each other. The first lapping portion 33-1 may have a rectangular shape or a polygonal shape, an orthographic projection of the first lapping portion 33-1 on the base substrate is at least partially overlapped with the orthographic projection of the connection block 71 on the base substrate, and the first lapping portion 33-1 is connected with the connection block 71 through the first lapping via. The second lapping portion 33-2 may have a rectangular shape or a polygonal shape and is disposed at a side of the first lapping portion 33-1 in the opposite direction of the first direction X, an orthographic projection of the second lapping portion 33-2 on the base substrate is at least partially overlapped with the orthographic projection of the data fan-out line 70 on the base substrate, the orthographic projection of the second lapping portion 33-2 on the base substrate is not overlapped with the orthographic projection of the first lapping via on the base substrate, and the second lapping portion 33-2 is configured to be connected with a data signal line formed subsequently through the second lapping via.

In an exemplary implementation, the shape and dimension of the lapping electrode 33 of each sub-pixel may be different to be suitable for the position and shape of the connection block 71 of the sub-pixel in which the lapping electrode 33 is located.

In an exemplary implementation, the shield electrode 34 may be of a polygonal line shape of which the main body portion extends along the first direction X, an orthographic projection of the shield electrode 34 on the base substrate is at least partially overlapped with an orthographic projection of the fourth active layer on the base substrate, the orthographic projection of the shield electrode 34 on the base substrate is at least partially overlapped with an orthographic projection of the first active layer on the base substrate, and the shield electrode 34 is configured to effectively shield the influence of a data voltage jump on a key node in the pixel drive circuit so as to prevent the data voltage jump from affecting the potential of the key node of the pixel drive circuit and to improve the display effect.

(6) Forming a pattern of a fourth insulation layer. In an exemplary implementation, forming a pattern of a fourth insulation layer may include: depositing a fourth insulating thin film on the base substrate on which the aforementioned patterns are formed, and patterning the fourth insulating thin film by a patterning process, to form a fourth insulation layer covering the second conductive layer, wherein a plurality of vias are provided on the fourth insulation layer, as shown in FIG. 15.

In an exemplary implementation, the plurality of vias of each sub-pixel at least include: a first via V1, a second via V2, a third via V3, a fourth via V4, a fifth via V5, a sixth via V6, a seventh via V7, an eighth via V8, a ninth via V9, and a tenth via V10.

In an exemplary implementation, an orthographic projection of the first via V1 on the base substrate is within a range of an orthographic projection of the opening 35 on the base substrate, the fourth insulation layer and the third insulation layer in the first via V1 are etched away to expose a surface of the first plate 24, and the first via V1 is configured such that the second electrode of the first transistor T1 formed subsequently (also the first electrode of the second transistor T2) is connected with the first plate 24 through the via V1.

In an exemplary implementation, an orthographic projection of the second via V2 on the base substrate is within a range of an orthographic projection of the second plate 32 on the base substrate, the fourth insulation layer in the second via V2 is etched away to expose a surface of the second plate 32, and the second via V2 is configured such that the first power supply line formed subsequently is connected with the second plate 32 through the via V2. In an exemplary implementation, there may be a plurality of second vias V2, and the plurality of second vias V2 may be disposed in sequence along the second direction Y to improve connection reliability.

In an exemplary implementation, an orthographic projection of the third via V3 on the base substrate is within a range of an orthographic projection of the first zone of the fifth active layer on the base substrate. The fourth insulation layer, the third insulation layer and the second insulation layer in the third via V3 are etched away to expose a surface of the first zone of the fifth active layer, and the third via V3 is configured such that the first power line formed subsequently is connected with the first zone of the fifth active layer through the via V3.

In an exemplary implementation, an orthographic projection of the fourth via V4 on the base substrate is within a range of an orthographic projection of the second zone of the sixth active layer on the base substrate. The fourth insulation layer, the third insulation layer and the second insulation layer in the fourth via V4 are etched away to expose a surface of the second zone of the sixth active layer, the fourth via V4 is configured such that the second electrode of the sixth transistor T6 (also the second electrode of the seventh transistor T7) formed subsequently is connected with the second zone of the sixth active layer (also the second zone of the seventh active layer) through the via V4.

In an exemplary implementation, an orthographic projection of the fifth via V5 on the base substrate is within a range of an orthographic projection of the first zone of the fourth active layer on the base substrate. The fourth insulation layer, the third insulation layer and the second insulation layer in the fifth via V5 are etched away to expose a surface of the first zone of the fourth active layer, and the fifth via V5 is configured such that the data signal line formed subsequently is connected with the first zone of the fourth active layer through the via V5.

In an exemplary implementation, an orthographic projection of the sixth via V6 on the base substrate is within a range of an orthographic projection of the second zone of the first active layer (also the first zone of the second active layer) on the base substrate. The fourth insulation layer, the third insulation layer and the second insulation layer in the sixth via V6 are etched away to expose a surface of the second zone of the first active layer, the sixth via V6 is configured such that the second electrode of the first transistor T1 (also the first electrode of the second transistor T2) formed subsequently is connected with the second zone of the first active layer (also the first zone of the second active layer) through the via V6.

In an exemplary implementation, an orthographic projection of the seventh via V7 on the base substrate is within a range of an orthographic projection of the first zone of the first active layer (also the first zone of the seventh active layer) on the base substrate. The fourth insulation layer, the third insulation layer and the second insulation layer in the seventh via V7 are etched away to expose a surface of the first zone of the first active layer, the seventh via V7 is configured such that the first electrode of the first transistor T1 (also the first electrode of the seventh transistor T7) formed subsequently is connected with the first zone of the first active layer (also the first zone of the seventh active layer) through the via V7.

In an exemplary implementation, an orthographic projection of the eighth via V8 on the base substrate is within a range of an orthographic projection of the shield electrode 34 on the base substrate. The fourth insulation layer in the eighth via V8 is etched away to expose a surface of the shield electrode 34, and the eighth via V8 is configured such that the first power supply line formed subsequently is connected with the shield electrode 34 through the eighth via V8.

In an exemplary implementation, an orthographic projection of the ninth via V9 on the base substrate is within a range of an orthographic projection of the second lapping portion 33-2 in the lapping electrode 33 on the base substrate. The fourth insulation layer in the ninth via V9 is etched away to expose a surface of the second lapping portion 33-2. The ninth via V9, which may be referred to as the second lapping via, is configured such that the data signal line formed subsequently is connected with the second lapping portion 33-2 through the via V9, so as to realize the connection of the data signal line with the data fan-out line 70 through the lapping electrode 33. In an exemplary implementation, the orthographic projection of the ninth via V9 on the base substrate is not overlapped with the orthographic projection of the first lapping via on the base substrate.

In an exemplary embodiment, an orthographic projection of the tenth via V10 on the base substrate is within a range of an orthographic projection of the initial signal line 31 on the base substrate. The fourth insulating layer in the tenth via V10 is etched away to expose a surface of the initial signal line 31. The tenth via V10 is configured such that the first electrode of the first transistor T1 (also the first electrode of the seventh transistor T7) formed subsequently is connected with the initial signal line 31 through the tenth via V10.

(7) Forming a pattern of a third conductive layer. In an exemplary implementation, forming a third conductive layer may include: depositing a third conductive thin film on the base substrate on which the above-mentioned patterns are formed, and patterning the third conductive thin film through a patterning process to form a third conductive layer disposed on the fourth insulation layer, as shown in FIG. 16a and FIG. 16b, and FIG. 16b is a planar schematic diagram of the third conductive layer in FIG. 16a. In an exemplary implementation, the third conductive layer may be referred to as a first source drain metal (SD1) layer.

In an exemplary implementation, the third conductive layer of each sub-pixel at least includes a first connection electrode 41, a second connection electrode 42, a third connection electrode 43, a first power supply line 44, and a data signal line 60.

In an exemplary implementation, the first connection electrode 41 may be of a straight line shape of which the main body portion extends along the second direction Y. The first end of the first connection electrode 41 is connected with the first plate 24 through the first via V1, and the second end of the first connection electrode 41 is connected with the second zone of the first active layer (also the first zone of the second active layer) through the sixth via V6, so that the first plate 24, the second zone of the first active layer and the first zone of the second active layer have the same potential. In an exemplary implementation, the first connection electrode 41 may serve as the second electrode of the first transistor T1 and the first electrode of the second transistor T2 simultaneously.

In an exemplary implementation, the second connection electrode 42 may be of a polygonal line shape of which the main body portion extends along the second direction Y. A first end of the second connection electrode 42 is connected with the initial signal line 31 through the tenth via V10, and a second end of the second connection electrode 42 is connected with the first zone of the first active layer (also a first zone of the seventh active layer) through the seventh via V7. In an exemplary implementation, the second connection electrode 42 may serve as the first electrode of the first transistor T1 and the first electrode of the seventh transistor T7 simultaneously.

In an exemplary implementation, the third connection electrode 43 may be of a strip shape, and the third connection electrode 43 is connected with the second zone of the sixth active layer (also the second zone of the seventh active layer) through the fourth via V4. In an exemplary implementation, the third connection electrode 43 may serve as the second electrode of the sixth transistor T6 and the second electrode of the seventh transistor T7 simultaneously, and the third connection electrode 43 is configured to be connected with an anode connection electrode formed subsequently.

In an exemplary implementation, the first power supply line 44 may be of a straight line shape of which the main body portion extends along the second direction Y. On the one hand, the first power supply line 44 is connected with the second plate 32 through the second via V2, on the other hand, the first power supply line 44 is connected with the first zone of the fifth active layer through the third via V3, and on still another hand, the first power supply line 44 is connected with the shield electrode 34 through the eighth via V8, so that a power supply signal is written to the first electrode of the fifth transistor T5, and the second plate 32, the first electrode of the fifth transistor T5, and the shield electrode 34 have the same potential.

In an exemplary implementation, since the shield electrode 34 is connected to the first power line 44, the shield electrode 34 can effectively shield the influence of the data voltage jump on the key node in the pixel drive circuit, thus avoiding the data voltage jump affecting the potential of the key node in the pixel drive circuit, and improving the display effect.

In an exemplary implementation, the data signal line 60 may be of a straight line shape of which the main body portion extends along the second direction Y. On the one hand, the data signal line 60 is connected with a first zone of the fourth active layer through the fifth via V5, such that a data signal is written to the first electrode of the fourth transistor T4, and on the other hand, the data signal line 60 is connected with the lapping electrode 33 through the ninth via V9. Since the lapping electrode 33 is connected with the data fan-out line 70 through the first lapping via, the data signal line 60 is connected with the data fan-out line 70.

(8) Forming a pattern of a first planarization layer. In an exemplary implementation, forming a pattern of a first planarization layer may include: first depositing the fifth insulating film on the base substrate on which the aforementioned patterns are formed, then coating a planarization thin film, and patterning the first planarization thin film and the fifth insulating film through a patterning process to form a fifth insulation layer covering the pattern of the third conductive layer and the first planarization layer disposed on the fifth insulation layer, wherein the first planarization layer is provided with a plurality of vias, as shown in FIG. 17.

In an exemplary implementation, the plurality of vias in each sub-pixel at least include a twenty-first via V21 and a twenty-second via V22.

In an exemplary implementation, an orthographic projection of the twenty-first via V21 on the base substrate is within a range of an orthographic projection of the third connection electrode 43, the first planarization layer and the fifth insulation layer in the twenty-first via V21 is etched away to expose a surface of the third connection electrode 43, and the twenty-third via V23 is configured such that an anode connection electrode formed subsequently is connected with the third connection electrode 43 through the twenty-third via V23.

In an exemplary implementation, an orthographic projection of the twenty-second via V22 on the base substrate is within a range of an orthographic projection of the first power supply line 44 on the base substrate, the first planarization layer and the fifth insulation layer in the twenty-second via V22 is etched away to expose a surface of the first power supply line 44, and the twenty-second via V22 is configured such that the power supply line formed subsequently is connected with the first power supply line 44 through the twenty-second via V22.

(9) Forming a pattern of a fourth conductive layer. In an exemplary implementation, forming a pattern of a fourth conductive layer may include: depositing a fourth conductive thin film on the base substrate on which the aforementioned patterns are formed, and patterning the fourth conductive thin film through a patterning process to form a fourth conductive layer disposed on the first planarization layer, as shown in FIG. 18a and FIG. 18b, and FIG. 18b is a planar schematic diagram of the fourth conductive layer in FIG. 18a. In an exemplary implementation, the fourth conductive layer may be referred to as a second source drain metal (SD2) layer.

In an exemplary implementation, the fourth conductive layer of each sub-pixel at least includes an anode connection electrode 51 and a power supply connection line 52.

In an exemplary implementation, the anode connection electrode 51 may be of a strip shape of which the main body portion extends along the second direction Y, the anode connection electrode 51 is connected with the third connection electrode 53 through the twenty-first via V21, and the anode connection electrode 51 is configured to be connected with the anode formed subsequently. Since the third connection electrode 53 is connected with the second zone of the sixth active layer (also the second zone of the seventh active layer) through a via, the connection of the anode formed subsequently with the second electrode of the sixth transistor T6 and the second electrode of the seventh transistor T7 can be realized.

In an exemplary implementation, the power supply connection lines 52 may be of a grid shape and the power supply connection lines 52 may include a plurality of first connection lines 52-1 and a plurality of second connection lines 52-2. The first connection line 52-1 may be of a straight line shape or a polygonal line shape of which the main body portion extends along the first direction X, a plurality of first connection lines 52-1 may be disposed at intervals along the second direction Y. The second connection line 52-2 may be of a straight line shape or a polygonal line shape of which the main body portion extends along the second direction Y, a plurality of second connection lines 52-2 may be disposed at intervals along the first direction X, the first connection line 52-1 and the second connection line 52-2 are connected with each other to form a grid structure, and the second connection line 52-2 is connected with the first power supply line 44 through the twenty-second via V22.

In an exemplary implementation, the power supply connection lines 52 in two adjacent sub-pixels in one pixel row may be an integral structure connected with each other. The power supply connection lines 52 in two adjacent sub-pixels in one sub-pixel column may be an integral structure connected with each other. The formed grid-shaped power supply connection lines 52 can ensure that the first power supply lines of all sub-pixels have the same potential, which is beneficial to improving the uniformity of the panel, avoiding poor display of the display substrate and ensuring the display effect of the display substrate.

In an exemplary implementation, the first connection line 52-1 and the second connection line 52-2 may be polygonal lines with non-equal widths, which may not only facilitate the layout of the pixel structure, but also reduce the parasitic capacitance generated by the power supply connection lines 52.

(10) Forming a pattern of a second planarization layer. In an exemplary implementation, forming a pattern of a second planarization layer may include: coating a second planarization thin film on the base substrate on which the aforementioned patterns are formed, and patterning the second planarization thin film through a patterning process to form a second planarization layer covering the pattern of the fourth conductive layer, wherein the second planarization layer is provided with a plurality of vias, as shown in FIG. 19a and FIG. 19b, and FIG. 19b is a schematic diagram of the position relationship between the anode via and the lapping via according to an exemplary embodiment of the present disclosure.

As shown in FIG. 19a, in an exemplary implementation, the via of each sub-pixel at least includes an anode via AV. An orthographic projection of the anode via AV on the base substrate is within a range of an orthographic projection of the anode connection electrode 51 on the base substrate. The second planarization layer in the anode via AV is removed to expose a surface of the anode connection electrode 51. The anode via AV is configured such that an anode formed subsequently is connected with the anode connection electrode 51 through the anode via AV.

As shown in FIG. 19b, in an exemplary implementation, an orthographic projection of the anode via AV on the base substrate is not overlapped with an orthographic projection of the first lapping via DV1 on the base substrate.

In an exemplary implementation, in at least one sub-pixel, a first distance L1 between an edge of a side of the anode via AV close to the first lapping via DV1 and an edge of a side of the first lapping via DV1 close to the anode via AV may be greater than or equal to 2.5 μm, and the first distance L1 may be a minimum distance between the anode via AV and the first lapping via DV1. For example, in at least one sub-pixel, the first distance L1 between the anode via AV and the first lapping via DV1 may be about 5.65 μm. Since the first lapping via is a deep hole penetrating through the second flexible layer, and a depth of the first lapping via is about 6 μm to 8 μm. In the present disclosure, by disposing the anode via beyond the predefined distance of the first lapping via, the planarization of the anode formed subsequently may be ensured, the planarization of pixels and the display quality may be improved.

Hereto, the drive circuit layer pattern is prepared on the base substrate. In a plane parallel to the display substrate, the drive circuit layer may include a plurality of circuit units, each of the circuit units may include a pixel drive circuit, the pixel drive circuit is connected with a first scan signal line, a second scan signal line, a light emitting control line, an initial signal line, a data signal line, and a first power supply line. In a plane perpendicular to the display substrate, the drive circuit layer may be disposed on the base substrate, and the base substrate may include a first flexible layer, a barrier layer, a base substrate conductive layer and a second flexible layer which are stacked, and the base substrate conductive layer may at least include a data fan-out line.

The drive circuit layer may include a first insulation layer, a semiconductor layer, a second insulation layer, a first conductive layer, a third insulation layer, a second conductive layer, a fourth insulation layer, a third conductive layer, a fifth insulation layer, a first planarization layer, a fourth conductive layer and second planarization layer which are disposed sequentially on the base substrate. The semiconductor layer may at least include active layers of the first transistor to the seventh transistor. The first conductive layer may at least include gate electrodes of the first transistor to the seventh transistor and the first plate of a storage capacitor. The second conductive layer may at least include a lapping electrode and the second plate of the storage capacitor. The lapping electrode is connected with a data fan-out line through the first lapping via. The third conductive layer may at least include a data signal line, the first power supply line, the first electrodes and the second electrodes of a plurality of transistors. The data signal line is connected with the lapping electrode through the second lapping via. The fourth conductive layer may at least include an anode connection electrode and a power supply connection line, and the power supply connection line is connected with the first power supply line through a via.

In an exemplary implementation, the first conductive layer, the second conductive layer, the third conductive layer, and the fourth conductive layer may be made of metal materials, such as any one or more of silver (Ag), copper (Cu), aluminum (Al), and molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo. The first insulation layer, the second insulation layer, the third insulation layer, the fourth insulation layer and the fifth insulation layer may be made of any one or more of silicon oxide (SiOx), silicon nitride (SiNx) and silicon oxynitride (SiON), and may be in a single layer, a plurality of layers, or a composite layer. The first insulation layer may be referred to as a buffer layer, the second insulation layer may be referred to as a gate insulation (GI) layer, the fourth insulation layer may be referred to as an interlayer dielectric (ILD) layer, and the fifth insulation layer may be referred to as a passivation (PVX) layer. The first planarization layer and the second planarization layer may be made of an organic material such as a resin.

In an exemplary implementation, after the driver circuit layer is prepared, a light emitting structure layer is prepared on the driver circuit layer, and the preparation process of the light emitting structure layer may include the following operations.

(11) Forming a pattern of an anode conductive layer. In an exemplary implementation, forming a pattern of an anode conductive layer may include: depositing an anode conductive thin film on the base substrate on which the aforementioned patterns are formed, and patterning the anode conductive thin film through a patterning process to form an anode conductive layer disposed on the second planarization layer, wherein the anode conductive layer at least includes a plurality of anode patterns, as shown in FIG. 20a and FIG. 20b, and FIG. 20b is a planar schematic diagram of the anode conductive layer in FIG. 20a.

In an exemplary implementation, the anode conductive layer may be a single-layer structure, such as Indium Tin Oxide (ITO) or Indium Zinc Oxide (IZO), or may adopt a multi-layer composite structure, such as ITO/Ag/ITO.

In an exemplary implementation, the plurality of anode patterns may include a first anode 301A of a red light emitting device, a second anode 301B of a blue light emitting device, a third anode 301C of a first green light emitting device, and a fourth anode 301D of a second green light emitting device. The first anode 301A may be located at a red sub-pixel emitting red light, the second anode 301B may be located at a blue sub-pixel emitting blue light, the third anode 301C may be located at a first green sub-pixel emitting green light, and the fourth anode 301D may be located at a second green sub-pixel emitting green light.

In an exemplary implementation, the first anode 301A and the second anode 301B may be sequentially disposed along the first direction X, the third anode 301C and the fourth anode 301D may be sequentially disposed along the first direction X, and the third anode 301C and the fourth anode 301D may be disposed at a side of the first anode 301A and the second anode 301B in the second direction Y. Alternatively, the first anode 301A and the second anode 301B may be sequentially disposed along the second direction Y, the third anode 301C and the fourth anode 301D may be sequentially disposed along the second direction Y, and the third anode 301C and the fourth anode 301D may be disposed at a side of the first anode 301A and the second anode 301B in the first direction X.

In an exemplary implementation, the first anode 301A, the second anode 301B, the third anode 301C, and the fourth anode 301D may be respectively connected with the anode connection electrode 51 of the sub-pixel in which they are located through the anode via AV, and shapes and areas of the anodes of the four sub-pixels in one pixel unit may be the same or may be different.

In an exemplary implementation, at least one of the first anode 301A, the second anode 301B, the third anode 301C, and the fourth anode 301D may include an anode main body portion and an anode connection portion connected with each other, and the anode connection portion is connected with the anode connection electrode 51 through the anode via AV.

In an exemplary implementation, the first anode 301A may include a first anode main body portion and a first anode connection portion connected with each other, the first anode main body portion may have a rectangular shape, a circular arc-shaped chamfer may be provided at a corner of the rectangular shape, the first anode connection portion may have a strip shape, and the first anode connection portion is connected with the anode connection electrode 51 through the anode via AV. An orthographic projection of the first anode main body portion on the base substrate is at least partially overlapped with an orthographic projection of the second connection line 52-2 of the power supply connection line 52 on the base substrate.

In an exemplary implementation, the second anode 301B may include a second anode main body portion and a second anode connection portion connected with each other, the second anode main body portion may have a rectangular shape, a circular arc-shaped chamfer may be provided at a corner of the rectangular shape, the second anode connection portion may have a strip shape, and the second anode connection portion is connected with the anode connection electrode 51 through the anode via AV. An orthographic projection of the second anode main body portion on the base substrate is at least partially overlapped with an orthographic projection of one second connection line 52-2 of the power supply connection lines 52 on the base substrate.

In an exemplary implementation, the third anode 301C may include a third anode main body portion and a third anode connection portion connected with each other, the third anode main body portion may have a rectangular shape, a circular arc-shaped chamfer may be provided at a corner of the rectangular shape, the third anode connection portion may have a strip shape, and the third anode connection portion is connected with the anode connection electrode 51 through the anode via AV. An orthographic projection of the third anode main body portion on the base substrate is at least partially overlapped with an orthographic projection of one second connection line 52-2 of the power supply connection lines 52 on the base substrate.

In an exemplary implementation, the fourth anode 301B may include a fourth anode main body portion and a fourth anode connection portion connected with each other, the fourth anode main body portion may have a rectangular shape, a circular arc-shaped chamfer may be provided at a corner of the rectangular shape, the fourth anode connection portion may have a strip shape, and the fourth anode connection portion is connected with the anode connection electrode 51 through the anode via AV. An orthographic projection of the fourth anode main body portion on the base substrate is at least partially overlapped with the orthographic projection of one second connection line 52-2 of the power supply connection lines 52 on the base substrate.

(12) Forming a pattern of a pixel definition layer. In an exemplary implementation, forming a pattern of a pixel definition layer may include: coating a pixel definition thin film on the base substrate on which the aforementioned patterns are formed, patterning the pixel definition thin film by a patterning process to form a pixel definition layer, wherein the pixel definition layer of each sub-pixel is provided with a pixel opening PV, and the pixel definition thin film in the pixel opening PV is removed to expose the anode of the sub-pixel, as shown in FIG. 21a and FIG. 21b, and FIG. 21b is a schematic diagram of the positional relationship among the pixel opening, the anode via and the first lapping via according to an embodiment of the present disclosure.

In an exemplary implementation, an orthographic projection of the pixel opening PV on the base substrate is not overlapped with the orthographic projection of the anode via AV on the base substrate.

In an exemplary implementation, in at least one sub-pixel, a second distance L2 between an edge of a side of the pixel opening PV close to the anode via AV side and an edge of a side of the anode via AV close to the pixel opening PV side may be greater than or equal to 3.0 μm, and the second distance L2 may be a minimum distance between the pixel opening PV and the anode via AV. For example, in at least one sub-pixel, the second distance L2 between the pixel opening PV and the anode via AV may be about 7.88 μm. Since the anode via is a via penetrating through the second planarization layer, by disposing the pixel opening beyond the predefined distance of the anode via in the present disclosure, the planarization of the anode in the pixel opening may be ensured, the planarization of the pixel and the display quality may be improved.

In an exemplary implementation, the orthographic projection of the pixel opening PV on the base substrate is not overlapped with the orthographic projection of the first lapping via DV1 on the base substrate.

In an exemplary implementation, in at least one sub-pixel, a third distance L3 between an edge of a side of the pixel opening PV close to the first lapping via DV1 and an edge of a side of the first lapping via DV1 close to the pixel opening PV may be greater than or equal to 2.5 μm, and the third distance L3 may be a minimum distance between the pixel opening PV and the first lapping via DV1. For example, in at least one sub-pixel, the third distance L3 between the pixel opening PV and the first lapping via DV1 may be about 6.35 μm. Since the lapping via is a deep hole penetrating through the second flexible layer, by disposing the pixel opening beyond the predefined distance of the lapping via in the present disclosure, the planarization of the anode in the pixel opening may be ensured, the planarization of the pixel and the display quality may be improved.

In an exemplary implementation, a subsequent preparation process may include: forming an organic light emitting layer using an evaporation process and inkjet printing process at first, then forming a cathode on the organic light emitting layer, and then forming an encapsulation structure layer, wherein the encapsulation structure layer may include a first encapsulation layer, a second encapsulation layer and a third encapsulation layer which are stacked, the first encapsulation layer and the third encapsulation layer may be made of an inorganic material, the second encapsulation layer may be made of an organic material, and the second encapsulation layer is disposed between the first encapsulation layer and the third encapsulation layer, which may ensure that external water vapor cannot enter the light emitting device.

FIG. 22 is a schematic diagram of a sectional structure of a display substrate according to an exemplary embodiment of the present disclosure, illustrating a sectional structure of the region A in FIG. 7. As shown in FIG. 22, in a plane perpendicular to the display substrate, the display substrate may include a drive circuit layer 102 disposed on a base substrate 101, a light emitting structure layer 103 disposed at a side of the drive circuit layer 102 away from the base substrate 101, and an encapsulation structure layer 104 disposed at a side of the light emitting structure layer 103 away from the base substrate 101.

In an exemplary implementation, the base substrate 101 may include a first flexible layer 101A, a barrier layer 101B, a data fan-out line 70, and a second flexible layer 101C. The barrier layer 101B is disposed on the first flexible layer 101A, the base substrate conductive layer is disposed at a side of the barrier layer 101B away from the first flexible layer 101A, and the second flexible layer 101C is disposed at a side of the base substrate conductive layer away from the first flexible layer 101A, the base substrate conductive layer at least includes the data fan-out line 70, and the base substrate conductive layer may be referred to as the 0th source drain metal (SD0) layer.

In an exemplary implementation, the drive circuit layer 102 may include a first insulation layer 81, a semiconductor layer, a second insulation layer 82, a first conductive layer, a third insulation layer 83, a second conductive layer, a fourth insulation layer 84, a third conductive layer, a fifth insulation layer 85, a first planarization layer 91, a fourth conductive layer, and a second planarization layer 92 stacked in sequence on the base substrate 101.

The first insulation layer 81 is disposed at a side of the second flexible layer 101C away from the first flexible layer 101A, and the semiconductor layer is disposed at a side of the first insulation layer 81 away from the base substrate 101, the semiconductor layer at least includes the active layer of the transistor.

The second insulation layer 82 covers the semiconductor layer, and the first conductive layer is disposed at a side of the second insulation layer 82 away from the base substrate 101, the first conductive layer at least includes the gate electrode of the transistor, and the first conductive layer may be referred to as a first gate metal (GATE1) layer.

The third insulation layer 83 covers the first conductive layer on which the first lapping via DV1 is disposed. The third insulation layer 83, the second insulation layer 82, the first insulation layer 81 and the second flexible layer 101C in the first lapping via DV1 are removed to expose the surface of the data fan-out line 70.

The second conductive layer is disposed at a side of the third insulation layer 83 away from the base substrate 101, the second conductive layer at least includes a lapping electrode 33, the lapping electrode 33 is connected with the data fan-out line 70 through the first lapping via DV1, and the second conductive layer may be referred to as a second gate metal (GATE2) layer.

The fourth insulation layer 84 covers the second conductive layer on which a second lapping via DV2 and a plurality of active vias are provided. The fourth insulation layer 84 in the second lapping via DV2 is removed to expose a surface of the lapping electrode 33, and the fourth insulation layer 84, the third insulation layer 83 and the second insulation layer 82 in the active vias are removed to expose a surface of the active layer.

The third conductive layer is disposed at a side of the fourth insulation layer 84 away from the base substrate 101, the third conductive layer at least includes a data signal line 60 and a plurality of connection electrodes, the data signal line 60 is connected with a lapping electrode 33 through a second lapping via DV2, and the plurality of connection electrodes are respectively connected with corresponding active layers through a plurality of active vias. The third conductive layer may be referred to as a first source drain metal (SD1) layer.

The fifth insulation layer 85 covers the third conductive layer, the first planarization layer 91 is disposed at a side of the fifth insulation layer 85 away from the base substrate 101, the first planarization layer 91 is provided with a planarization via, and the first planarization layer 91 and the fifth insulation layer 85 in the planarization via are removed to expose a surface of the connection electrode.

The fourth conductive layer is disposed at a side of the first planarization layer 91 away from the base substrate 101, the fourth conductive layer at least includes an anode connection electrode 51, the anode connection electrode 51 is connected with the connection electrode through the planarization via. The fourth conductive layer may be referred to as a second source-drain metal (SD2) layer.

The second planarization layer 92 covers the fourth conductive layer and is provided with an anode via AV. The second planarization layer 92 within the anode via AV is removed to expose a surface of the anode connection electrode 51.

In an exemplary implementation, the light emitting structure layer 103 may at least include an anode 301, a pixel definition layer 302, an organic light emitting layer 303 and a cathode 304. The anode 301 is disposed at a side of the second planarization layer 92 away from the base substrate 101 and is connected with the anode connection electrode 51 through the anode via AV. The pixel definition layer 320 covers the anode 301 and is provided with an pixel opening PV, and the pixel definition layer 302 within the pixel opening PV is removed to expose a surface of the anode 301. The organic light emitting layer 303 is connected with the anode 301 through the pixel opening PV, the cathode 304 is disposed at a side of the organic light emitting layer 303 away from the base substrate 101, and the organic light emitting layer 303 emits light of corresponding color driven by the anode 301 and the cathode 304.

In an exemplary implementation, the encapsulation structure layer 104 may include a first encapsulation layer 401, a second encapsulation layer 402, and a third encapsulation layer 403 that are stacked. The first encapsulation layer 401 and the third encapsulation layer 403 may be made of an inorganic material, and the second encapsulation layer 402 may be made of an organic material. The second encapsulation layer 402 is disposed between the first encapsulation layer 401 and the third encapsulation layer 403 to form an inorganic material/organic material/inorganic material laminated structure, which can ensure that external moisture cannot enter the light emitting structure layer 103.

As can be seen from the structure and preparation process of the display substrate described above, in the display substrate provided by the present disclosure, a base substrate conductive layer is disposed between the double flexible layers of the base substrate, the base substrate conductive layer includes a data fan-out line, and the data fan-out line is connected with a data signal line through a lapping via, thus realizing data trace in the display region, which may reduce the width of the lower bezel and be beneficial to realizing a full-screen display. In the display substrate provide by an exemplary embodiment of the present disclosure, by setting the position and spacing between the lapping via and the anode via, the position and spacing between the lapping via and the pixel opening, and the position and spacing between the anode via and the pixel opening, the influence of the lapping via with the deep hole structure on the anode planarization is avoided, the planarization of the anode, the planarization of the pixel and the display quality are improved. The preparation process according to an exemplary embodiment of the present disclosure may be compatible well with an existing preparation process, and the process is simple to implement and is easy to carry out, and has high production efficiency, a low production cost and a high yield.

FIG. 23 is a schematic diagram of a sectional structure of another display substrate according to an exemplary embodiment of the present disclosure, illustrating an LTPO display substrate. As shown in FIG. 23, in a plane perpendicular to the display substrate, the display substrate may include a drive circuit layer 102 disposed on a base substrate 101, a light emitting structure layer 103 disposed at a side of the drive circuit layer 102 away from the base substrate 101, and an encapsulation structure layer 104 disposed at a side of the light emitting structure layer 103 away from the base substrate 101.

In an exemplary implementation, the base substrate 101 may include a first flexible layer 101A, a barrier layer 101B, a data fan-out line 70, and a second flexible layer 101C. The structures of the first flexible layer 101A, the barrier layer 101B, and the second flexible layer 101C are substantially the same as those shown in FIG. 22. A base substrate conductive layer is disposed at a side of the barrier layer 101B away from the first flexible layer 101A, the base substrate conductive layer at least includes a data fan-out line 70 and a shield layer 80, and the base substrate conductive layer may be referred to as a 0th source drain metal (SD0) layer.

In an exemplary implementation, the drive circuit layer 102 of the display region 100 may include a first insulation layer 81, a first semiconductor layer, a second insulation layer 82, a first conductive layer, a third insulation layer 83, a second conductive layer, a fourth insulation layer 84, a second semiconductor layer, a fifth insulation layer 85, a third conductive layer, a sixth insulation layer 86, a fourth conductive layer, a seventh insulation layer 87, a first planarization layer 91, a fifth conductive layer, and a second planarization layer 92 stacked in sequence on a base substrate 101.

The first insulation layer 81 is disposed at a side of the second flexible layer 101C away from the first flexible layer 101A, and the first semiconductor layer is disposed at a side of the first insulation layer 81 away from the base substrate 101, the first semiconductor layer at least includes an active layer of the LTPS transistor, an orthographic projection of the active layer of the LTPS transistor on the base substrate is within a range of an orthographic projection of the shield layer 80 on the base substrate.

The second insulation layer 82 covers the first semiconductor layer, and the first conductive layer is disposed at a side of the second insulation layer 82 away from the base substrate 101, the first conductive layer at least includes the gate electrode of the LTPS transistor, and the first conductive layer may be referred to as a first gate metal (GATE1) layer.

The third insulation layer 83 covers the first conductive layer, the second conductive layer is disposed at a side of the third insulation layer 83 away from the base substrate 101, the second conductive layer at least includes lower gate electrodes of the oxide transistors, and the second conductive layer may be referred to as a second gate metal (GATE2) layer.

The fourth insulation layer 84 covers the second conductive layer, and the second semiconductor layer is disposed at a side of the fourth insulation layer 84 away from the base substrate 101. The second semiconductor layer at least includes active layers of the oxide transistors.

The fifth insulation layer 85 covers the second semiconductor layer on which the first lapping via DV1 is provided. The fifth insulation layer 85, the fourth insulation layer 84, the third insulation layer 83, the second insulation layer 82, the first insulation layer 81 and the second flexible layer 101C in the first lapping via DV1 are removed to expose the surface of the data fan-out line 70.

The third conductive layer is disposed at a side of the fifth insulation layer 85 away from the base substrate 101, the third conductive layer at least includes upper gate electrodes of the oxide transistors and a lapping electrode 33, the lapping electrode 33 is connected with the data fan-out line 70 through the first lapping via DV1, and the third conductive layer may be referred to as a third gate metal (GATE3) layer.

The sixth insulation layer 86 covers the third conductive layer on which a second lapping via DV2, a plurality of LTPS active vias, and a plurality of oxide active vias are provided. The sixth insulation layer 86 in the second lapping via DV2 is removed to expose a surface of the lapping electrode 33. The sixth insulation layer 86, the fifth insulation layer 85, the fourth insulation layer 84, the third insulation layer 83, and the second insulation layer 82 in the LTPS active via are removed to expose a surface of the active layer of the LTPS transistor. The sixth insulation layer 86 and the fifth insulation layer 85 within the oxide active via are removed to expose surfaces of the active layers of the oxide transistors.

The fourth conductive layer is disposed at a side of the sixth insulation layer 86 away from the base substrate 101. The fourth conductive layer at least includes a data signal line 60, a plurality of LTPS connection electrodes and a plurality of oxide connection electrodes. The data signal line 60 is connected with the lapping electrode 33 through the second lapping via DV2, the plurality of LTPS connection electrodes are respectively connected with the active layers of the corresponding LTPS transistors through the plurality of LTPS active vias, the plurality of oxide connection electrodes are respectively connected with the active layers of the corresponding oxide transistors through the plurality of Oxide active vias, and the fourth conductive layer may be referred to as a first source-drain metal (SD1) layer.

The seventh insulation layer 87 covers the fourth conductive layer, the first planarization layer 91 is disposed at a side of the seventh insulation layer 87 away from the base substrate 101, the first planarization layer 91 is provided with a planarization via, and the first planarization layer 91 and the seventh insulation layer 87 in the planarization via are removed to expose a surface of the connection electrode.

The fifth conductive layer is disposed at a side of the first planarization layer 91 away from the base substrate 101, the fifth conductive layer at least includes an anode connection electrode 51, the anode connection electrode 51 is connected with the connection electrode through the planarization via, and the fifth conductive layer may be referred to as a second source-drain metal (SD2) layer.

The second planarization layer 92 covers the fifth conductive layer and is provided with an anode via AV. The second planarization layer 92 within the anode via AV is removed to expose a surface of the anode connection electrode 51.

In an exemplary implementation, the structures of the light emitting structure layer and the encapsulation structure layer in the display substrate are substantially the same as those shown in FIG. 22 and will not be repeated here.

In an LTPO display substrate, a first semiconductor layer (LTPS) is formed on the first insulation layer after a light shield layer is disposed on the base substrate and a first insulation layer covering the light shield layer is formed. A research shows that there exists a divergence of LTPS transistor due to a relatively small distance between the first semiconductor layer and the light shield layer. According to the display substrate provided by an exemplary embodiment of the present disclosure, not only data trace is realized by the data fan-out line disposed between the double flexible layers, but also the shielding to the LTPS transistor is realized by the light shield layer through the provision of the light shield layer and the data fan-out line in the base substrate conductive layer. Since the light shield layer is disposed between the first flexible layer and the second flexible layer, and the light shield layer and the first semiconductor layer are separated with the second flexible layer and the first insulation layer, a distance between the first semiconductor layer and the light shield layer is relatively large, thus effectively avoiding the problem of divergence of the LTPS transistor characteristics.

In an LTPO display substrate, the third conductive layer typically includes only the gate electrodes of the oxide transistors. A research shows that since a large area of metal needs to be etched in the patterning process of the third conductive layer, not only the etching load is relatively large, but also the etching uniformity is poor. In the display substrate provided by an exemplary embodiment of the present disclosure, by disposing the lapping electrode on the third conductive layer, the area of etched metal in the patterning process of the third conductive layer is reduced, the remained area of the third conductive layer is increased. Therefore, not only the etching load is reduced, but also the etching uniformity and the product quality are improved. The preparation process according to an exemplary embodiment of the present disclosure may be compatible well with an existing preparation process, and the process is simple to implement and is easy to carry out, and has high production efficiency, a low production cost and a high yield.

FIG. 24 is a schematic diagram of a sectional structure of yet another display substrate according to an exemplary embodiment of the present disclosure, illustrating an LTPO display substrate. As shown in FIG. 24, in a plane perpendicular to the display substrate, the display substrate may include a drive circuit layer 102 disposed on a base substrate 101, a light emitting structure layer 103 disposed at a side of the drive circuit layer 102 away from the base substrate 101, and an encapsulation structure layer 104 disposed at a side of the light emitting structure layer 103 away from the base substrate 101.

In an exemplary implementation, the structure of the base substrate in the display substrate is substantially the same as that shown in FIG. 23 and will not be repeated here.

In an exemplary implementation, the main body structure of the drive circuit layer in the display substrate is substantially the same as the main body structure shown in FIG. 23. The drive circuit layer 102 may include a first insulation layer 81, a first semiconductor layer, a second insulation layer 82, a first conductive layer, a third insulation layer 83, a second conductive layer, a fourth insulation layer 84, a second semiconductor layer, a fifth insulation layer 85, a third conductive layer, a sixth insulation layer 86, a fourth conductive layer, a seventh insulation layer 87, a first planarization layer 91, a fifth conductive layer, and a second planarization layer 92 stacked in sequence on a base substrate 101. The difference is that the first lapping via DV1 is formed in the process of forming the pattern of the second semiconductor layer, and the fourth insulation layer 84, the third insulation layer 83, the second insulation layer 82, the first insulation layer 81 and the second flexible layer 101C in the first lapping via DV1 are removed to expose the surface of the data fan-out line 70. The fifth insulation layer 85 covers the second semiconductor layer and the sidewall of the first lapping via DV1, but the fifth insulation layer 85 at the bottom of the first lapping via DV1 is removed to expose the surface of the data fan-out line 70. The third conductive layer is disposed at a side of the fifth insulation layer 85 away from the base substrate 101, the third conductive layer at least includes upper gate electrodes of the oxide transistors and a lapping electrode 33, the lapping electrode 33 is connected with the data fan-out line 70 through the first lapping via DV1.

In an exemplary implementation, the structures of other structure layer, the light emitting structure layer and the encapsulation structure layer in the display substrate are substantially the same as those shown in FIG. 23 and will not be repeated here.

In the display substrate provide by an exemplary embodiment of the present disclosure, not only the problem of divergence of LTPS transistor characteristics is effectively avoided and etching uniformity is improved, but also the process difficulty is reduced, the reliability of connecting the lapping electrode with the data fan outlet through the first lapping via is effectively improved and the product quality is improved through covering the sidewall of the first lapping via by the fifth insulation layer.

The structure shown and mentioned above in the present disclosure and the preparation process thereof are merely an exemplary description. In an exemplary implementation, the corresponding structures may be altered and the patterning processes may be added or reduced according to actual needs. For example, a part of lapping vias may be disposed in sub-pixels away from the first center line, so as to increase the spacing between adjacent lapping vias, reduce mutual interference, and ensure that no crosstalk is in the display screen, which is not limited in the present disclosure.

In an exemplary implementation, the display substrate of the present disclosure may be applied to other display devices having pixel drive circuits, such as quantum dot displays and the like, which is not limited in the present disclosure.

The present disclosure further provides a preparation method for a display substrate, for preparing the display substrate according to the foregoing embodiments. In an exemplary implementation, the display substrate may include a display region including a plurality of sub-pixels, at least one sub-pixel includes a circuit unit disposed on the base substrate; the preparation method may include: forming a base substrate, wherein the base substrate includes a first flexible layer, a second flexible layer, and a base substrate conductive layer disposed between the first flexible layer and the second flexible layer, wherein the base substrate conductive layer of at least one sub-pixel at least includes a data fan-out line; and forming a circuit unit on the base substrate, wherein the circuit unit at least includes a pixel drive circuit and a data signal line, and the pixel drive circuit is connected with the data signal line, the data signal line is connected with the data fan-out line through a lapping via.

The present disclosure further provides a display apparatus which includes the aforementioned display substrate. The display apparatus may be any product or component with a display function, such as a mobile phone, a tablet computer, a television, a display, a laptop computer, a digital photo frame, or a navigator, and the embodiments of the present invention are not limited thereto.

Although the implementations disclosed in the present disclosure are described as above, the described contents are only implementations which are used for facilitating the understanding of the present disclosure, but are not intended to limit the present invention. Any skilled person in the art to which the present disclosure pertains may make any modifications and variations in forms and details of implementation without departing from the spirit and scope of the present disclosure. However, the patent protection scope of the present invention should be subject to the scope defined by the appended claims.

The invention claimed is:

1. A display substrate, comprising a display region, wherein, the display region comprises a plurality of sub-pixels, at least one sub-pixel comprises a circuit unit disposed on a base substrate, the circuit unit comprises a pixel drive circuit and a data signal line, the pixel drive circuit is connected with the data signal line; the base substrate comprises a first flexible layer, a second flexible layer and a base substrate conductive layer disposed between the first flexible layer and the second flexible layer, the base substrate conductive layer of the at least one sub-pixel comprises a data fan-out line, and the data signal line is connected with the data fan-out line through a lapping via, wherein the circuit unit comprises a lapping electrode connected with the data fan-out line through a first lapping via, and the data signal line is connected with the lapping electrode through a second lapping via, wherein the at least one sub-pixel further comprises a light emitting device disposed at a side of the circuit unit away from the base substrate, the light emitting device comprises an anode, and the anode is connected with the pixel drive circuit through an anode via, and an orthographic projection of the first lapping via in a plane of the display substrate is not overlapped with an orthographic projection of the anode via in the plane of the display substrate, wherein the light emitting device further comprises a pixel definition layer on which a pixel opening is provided, and the pixel opening exposes the anode; an orthographic projection of the pixel opening in the plane of the display substrate is not overlapped with the orthographic projection of the anode via in the plane of the display substrate, and wherein the orthographic projection of the pixel opening in the plane of the display substrate is not overlapped with an orthographic projection of the first lapping via in the plane of the display substrate, a distance between an edge of a side of the pixel opening close to the first lapping via and an edge of a side of the first lapping via close to the pixel opening is greater than or equal to 2.5 μm, a distance between an edge of a side of the pixel opening close to the anode via and an edge of a side of the anode via close to the pixel opening is greater than or equal to 3.0 μm, a distance between an edge of a side of the first lapping via close to the anode via and an edge of a side of the anode via close to the first lapping via is greater than or equal to 2.5 μm.

2. The display substrate according to claim 1, wherein, the display region comprises a plurality of pixel rows sequentially disposed along a second direction, each pixel row comprises a plurality of sub-pixels sequentially disposed along a first direction, the second direction is an extension direction of the data signal line, the first direction intersects with the second direction; the display region is provided with a lapping zone at a middle portion in the second direction, the lapping zone comprises at least one pixel row, and the lapping via is disposed in at least one sub-pixel of the lapping zone.

3. The display substrate according to claim 2, wherein, lapping vias are disposed in a plurality of sub-pixels of one pixel row in the lapping zone, or lapping vias are disposed in a plurality of sub-pixels of a plurality of pixel rows in the lapping zone, and at least part of data signal lines are connected with data fan-out lines through the lapping vias.

4. The display substrate according to claim 3, wherein, in a plane perpendicular to the display substrate, the circuit unit comprises a semiconductor layer, a first conductive layer, a second conductive layer, a third conductive layer and a fourth conductive layer that are sequentially disposed on the base substrate; the semiconductor layer comprises active layers of a plurality of transistors, the first conductive layer comprises gate electrodes of a plurality of transistors and a first plate of a storage capacitor, the second conductive layer comprises a second plate of the storage capacitor, the third conductive layer comprises the data signal line, and the fourth conductive layer comprises an anode connection electrode.

5. The display substrate according to claim 2, wherein, in a plane perpendicular to the display substrate, the circuit unit comprises a semiconductor layer, a first conductive layer, a second conductive layer, a third conductive layer and a fourth conductive layer that are sequentially disposed on the base substrate; the semiconductor layer comprises active layers of a plurality of transistors, the first conductive layer comprises gate electrodes of a plurality of transistors and a first plate of a storage capacitor, the second conductive layer comprises a second plate of the storage capacitor, the third conductive layer comprises the data signal line, and the fourth conductive layer comprises an anode connection electrode.

6. The display substrate according to claim 1, wherein, the base substrate conductive layer further comprises a power supply electrode disposed in a region other than the data fan-out line, and the power supply electrode is in an entire surface structure or a mesh structure.

7. The display substrate according to claim 1, wherein, in a plane perpendicular to the display substrate, the circuit unit comprises a semiconductor layer, a first conductive layer, a second conductive layer, a third conductive layer and a fourth conductive layer that are sequentially disposed on the base substrate; the semiconductor layer comprises active layers of a plurality of transistors, the first conductive layer comprises gate electrodes of a plurality of transistors and a first plate of a storage capacitor, the second conductive layer comprises a second plate of the storage capacitor, the third conductive layer comprises the data signal line, and the fourth conductive layer at least comprises an anode connection electrode.

8. The display substrate according to claim 7, wherein, the second conductive layer further comprises the lapping electrode.

9. The display substrate according to claim 1, wherein, in a plane perpendicular to the display substrate, the pixel drive circuit comprises a first semiconductor layer, a first conductive layer, a second conductive layer, a second semiconductor layer, a third conductive layer, a fourth conductive layer and a fifth conductive layer that are sequentially disposed on the base substrate, the first semiconductor layer comprises active layers of a plurality of low temperature polysilicon transistors, the first conductive layer comprises gate electrodes of a plurality of low temperature polysilicon transistors and a first plate of a storage capacitor, the second conductive layer comprises lower gate electrodes of oxide transistors and a second plate of the storage capacitor, the second semiconductor layer comprises active layers of oxide transistors, the third conductive layer comprises upper gate electrodes of oxide transistors, the fourth conductive layer comprises the data signal line, and the fifth conductive layer comprises an anode connection electrode.

10. The display substrate according to claim 9, wherein, the third conductive layer comprises the lapping electrode.

11. The display substrate according to claim 10, wherein, the base substrate conductive layer further comprises a shield layer, and an orthographic projection of an active layer of a low temperature polysilicon transistor in a plane of the display substrate is within a range of an orthographic projection of the shield layer in the plane of the display substrate.

12. A display apparatus, comprising the display substrate according to claim 1.

13. A preparing method for a display substrate, wherein, the display substrate comprises a display region, and the display region comprises a plurality of sub-pixels, at least one sub-pixel comprises a circuit unit disposed on a base substrate, and the preparing method comprises:

forming a base substrate, wherein the base substrate comprises a first flexible layer, a second flexible layer, and a base substrate conductive layer disposed between the first flexible layer and the second flexible layer, the base substrate conductive layer of the at least one sub-pixel comprises a data fan-out line; and forming a circuit unit on the base substrate, wherein the circuit unit comprises a pixel drive circuit and a data signal line, and the pixel drive circuit is connected with the data signal line, the data signal line is connected with the data fan-out line through a lapping via;

wherein the circuit unit comprises a lapping electrode connected with the data fan-out line through a first lapping via, and the data signal line is connected with the lapping electrode through a second lapping via, wherein the at least one sub-pixel further comprises a light emitting device disposed at a side of the circuit unit away from the base substrate, the light emitting device comprises an anode, and the anode is connected with the pixel drive circuit through an anode via, and an orthographic projection of the first lapping via in a plane of the display substrate is not overlapped with an orthographic projection of the anode via in the plane of the display substrate, wherein the light emitting device further comprises a pixel definition layer on which a pixel opening is provided, and the pixel opening exposes the anode; an orthographic projection of the pixel opening in the plane of the display substrate is not overlapped with the orthographic projection of the anode via in the plane of the display substrate, and wherein the orthographic projection of the pixel opening in the plane of the display substrate is not overlapped with an orthographic projection of the first lapping via in the plane of the display substrate, a distance between an edge of a side of the pixel opening close to the first lapping via and an edge of a side of the first lapping via close to the pixel opening is greater than or equal to 2.5 μm, a distance between an edge of a side of the pixel opening close to the anode via and an edge of a side of the anode via close to the pixel opening is greater than or equal to 3.0 μm, a distance between an edge of a side of the first lapping via close to the anode via and an edge of a side of the anode via close to the first lapping via is greater than or equal to 2.5 μm.

* * * * *